United States Patent
Sim et al.

(10) Patent No.: US 11,100,959 B2
(45) Date of Patent: Aug. 24, 2021

(54) VARIABLE RESISTANCE MEMORY DEVICE

(71) Applicant: Samsung Electronics Co., Ltd., Suwon-si (KR)

(72) Inventors: Kyu-Rie Sim, Hwaseong-si (KR); Taehui Na, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/560,127

(22) Filed: Sep. 4, 2019

(65) Prior Publication Data
US 2020/0234736 A1    Jul. 23, 2020

(30) Foreign Application Priority Data
Jan. 23, 2019  (KR) .................. 10-2019-0008898

(51) Int. Cl.
| | |
|---|---|
| *G11C 5/06* | (2006.01) |
| *H01L 27/24* | (2006.01) |
| *G11C 5/02* | (2006.01) |
| *H01L 45/00* | (2006.01) |

(52) U.S. Cl.
CPC .............. *G11C 5/063* (2013.01); *G11C 5/025* (2013.01); *H01L 27/24* (2013.01); *H01L 45/06* (2013.01); *H01L 45/1253* (2013.01); *H01L 45/16* (2013.01)

(58) Field of Classification Search
CPC ..... G11C 5/063; G11C 5/025; G11C 2213/76; G11C 13/0004; G11C 13/0028; G11C 13/003; G11C 2213/71; G11C 13/0002; G11C 7/18; G11C 8/14; H01L 27/24; H01L 45/1253; H01L 45/16; H01L 45/06; H01L 45/126; H01L 45/1233; H01L 45/1226; H01L 45/144; H01L 45/1683; H01L 27/2481; H01L 27/249; H01L 27/2427; H01L 27/2409; H01L 23/5386
See application file for complete search history.

(56) References Cited

U.S. PATENT DOCUMENTS

| | | | |
|---|---|---|---|
| 7,994,493 | B2 | 8/2011 | Cho et al. |
| 8,581,225 | B2 | 11/2013 | Himeno et al. |
| 8,742,389 | B2 | 6/2014 | Lee |
| 9,172,039 | B2 | 10/2015 | Terai et al. |
| 9,437,293 | B1 | 9/2016 | Kripanidhi et al. |

(Continued)

*Primary Examiner* — Steven H Loke
*Assistant Examiner* — Juanita B Rhodes
(74) *Attorney, Agent, or Firm* — Harness, Dickey & Pierce, P.L.C.

(57) ABSTRACT

A variable resistance memory device includes memory cell stacks arranged in a first direction, the memory cell stacks including a first memory cell stack and a second memory cell stack. Each of the memory cell stacks includes a plurality of word lines, each word line of the plurality of word lines extending in a second direction intersecting the first direction and arranged in a third direction intersecting the first and second directions, and a memory cell connected to each of the plurality of word lines. Each of the memory cells includes a switching element and a variable resistance element. Each of the plurality of word lines of the first memory cell stack have a first thickness, in the first direction, of first word lines of the first memory cell stack is less than a second thickness, in the first direction, of each of the plurality of word lines of the second memory cell stack.

20 Claims, 33 Drawing Sheets

(56) References Cited

U.S. PATENT DOCUMENTS

| | | |
|---|---|---|
| 9,514,807 B2 | 12/2016 | Kang et al. |
| 9,679,947 B2 | 6/2017 | Yamato et al. |
| 9,991,315 B2 | 6/2018 | Terai et al. |
| 2017/0243918 A1* | 8/2017 | Terai .................... H01L 27/2427 |
| 2017/0271592 A1* | 9/2017 | Lee ...................... H01L 27/2427 |
| 2018/0159032 A1 | 6/2018 | Park et al. |

* cited by examiner

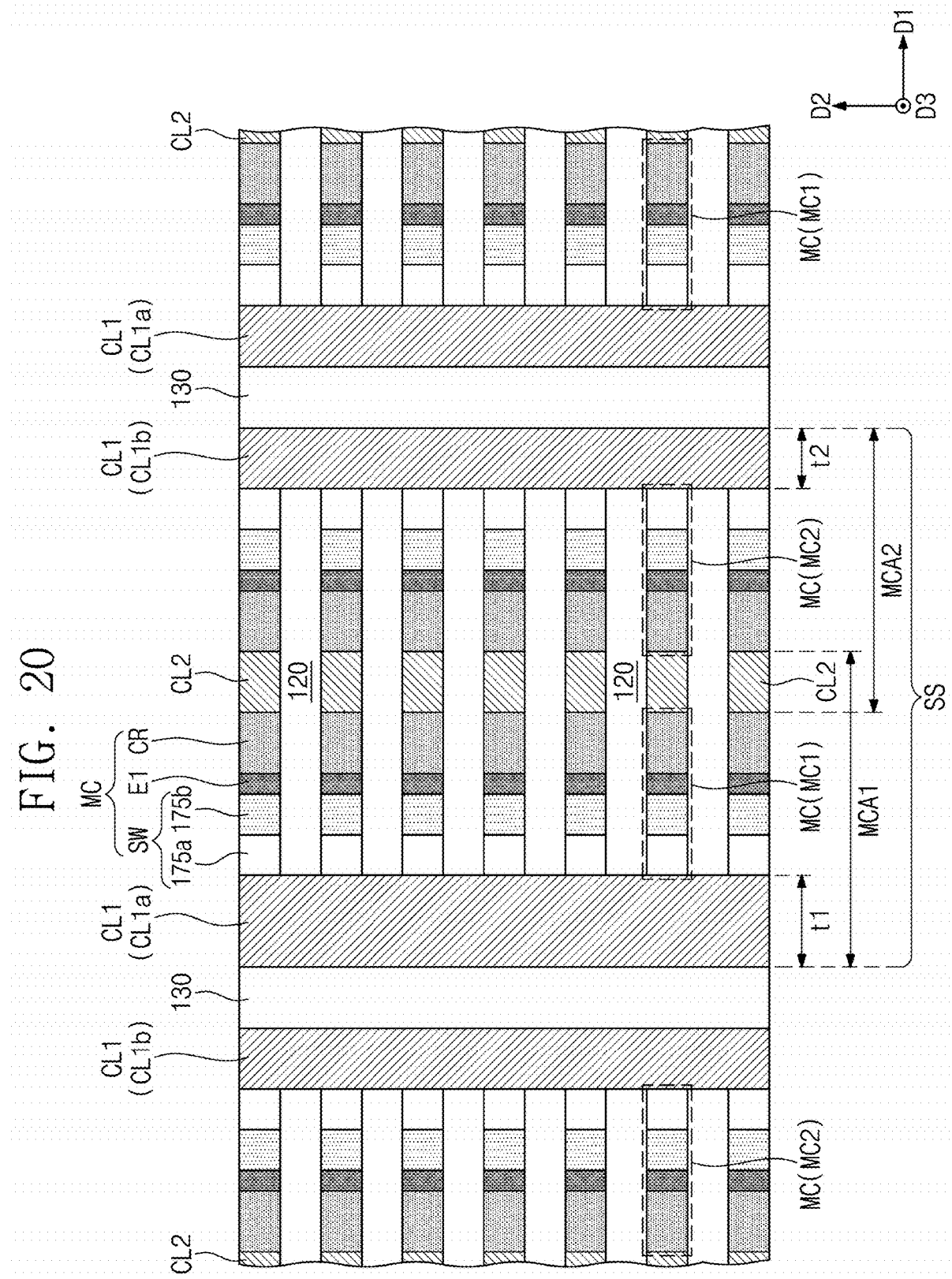

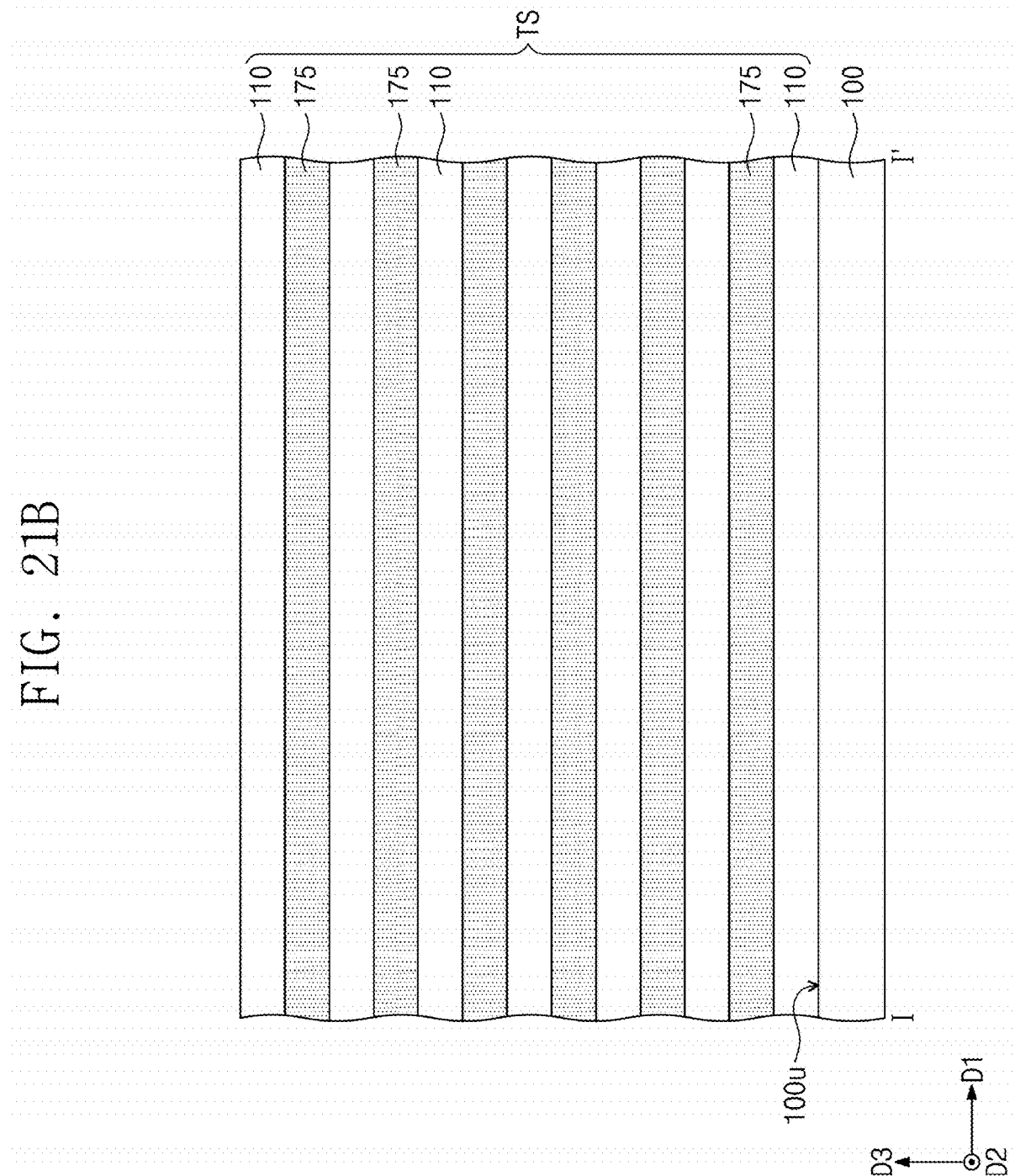

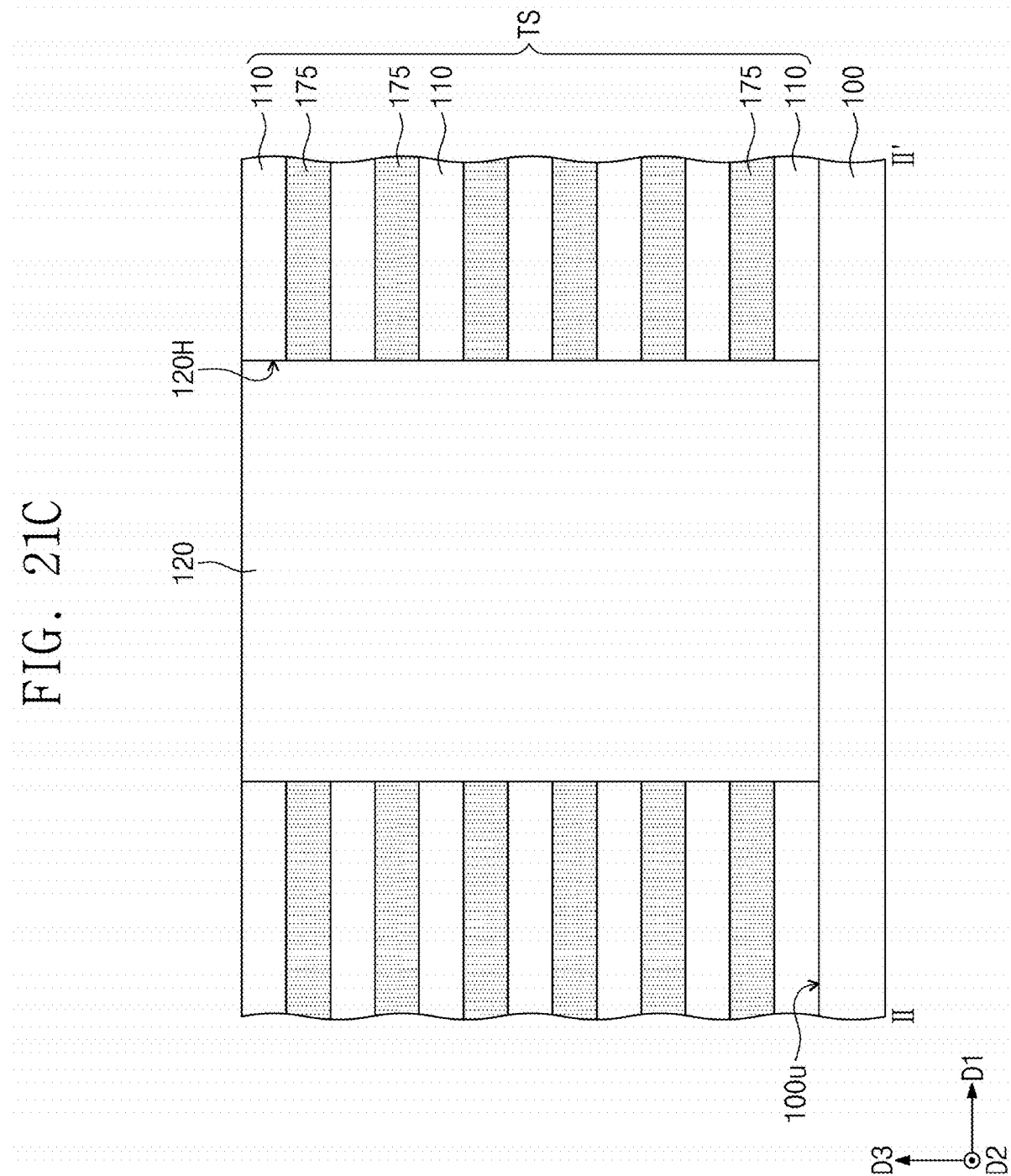

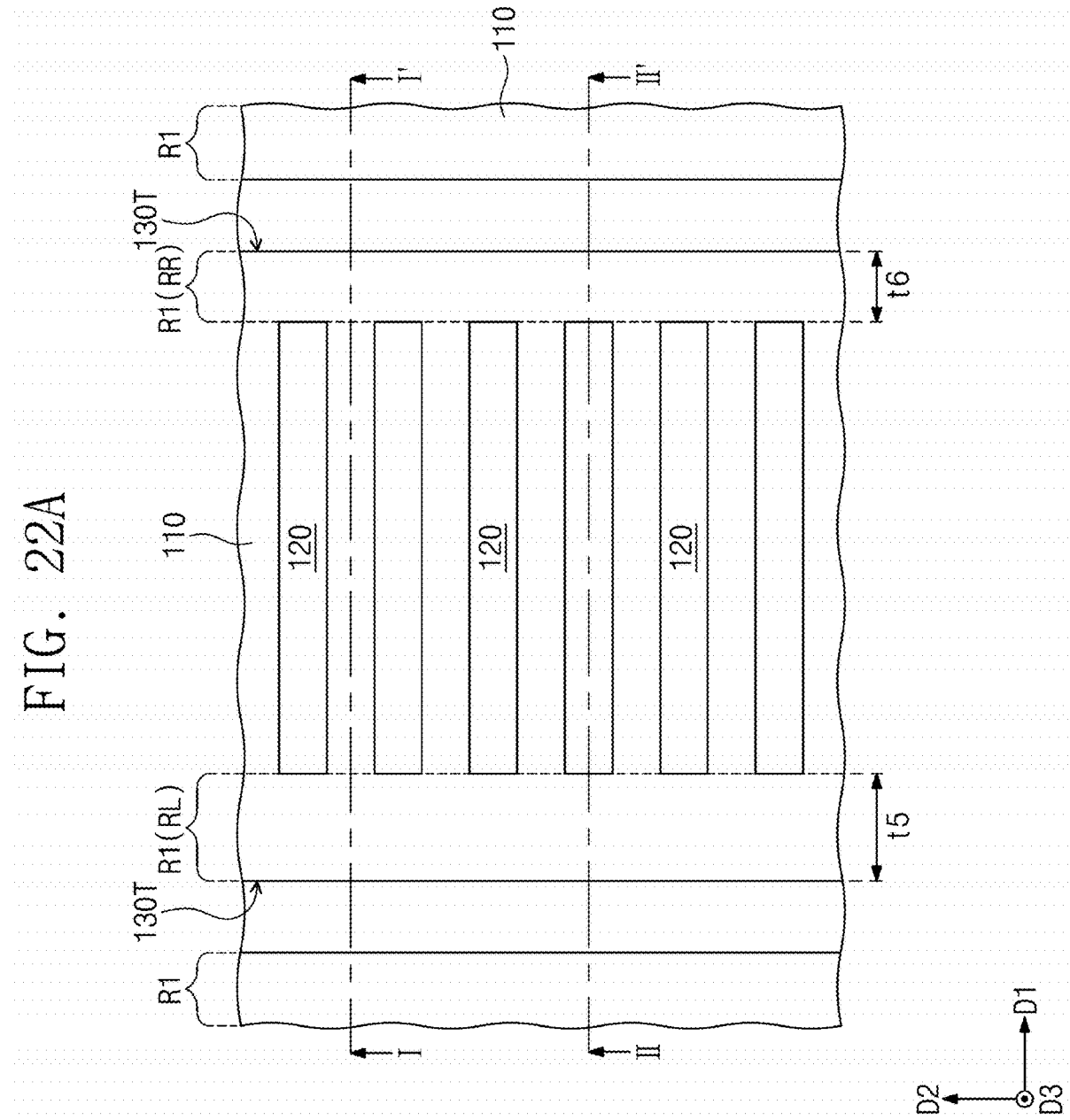

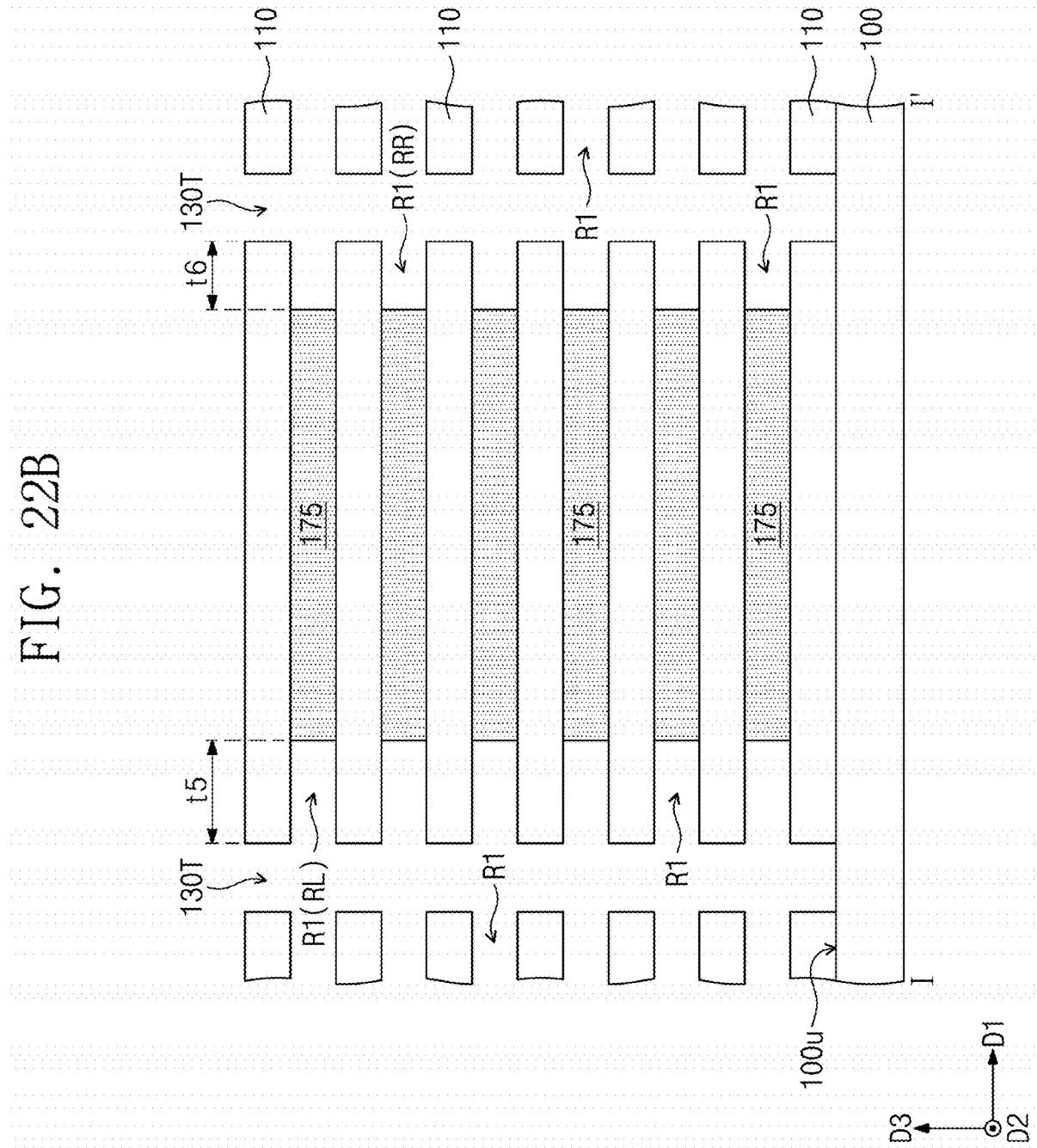

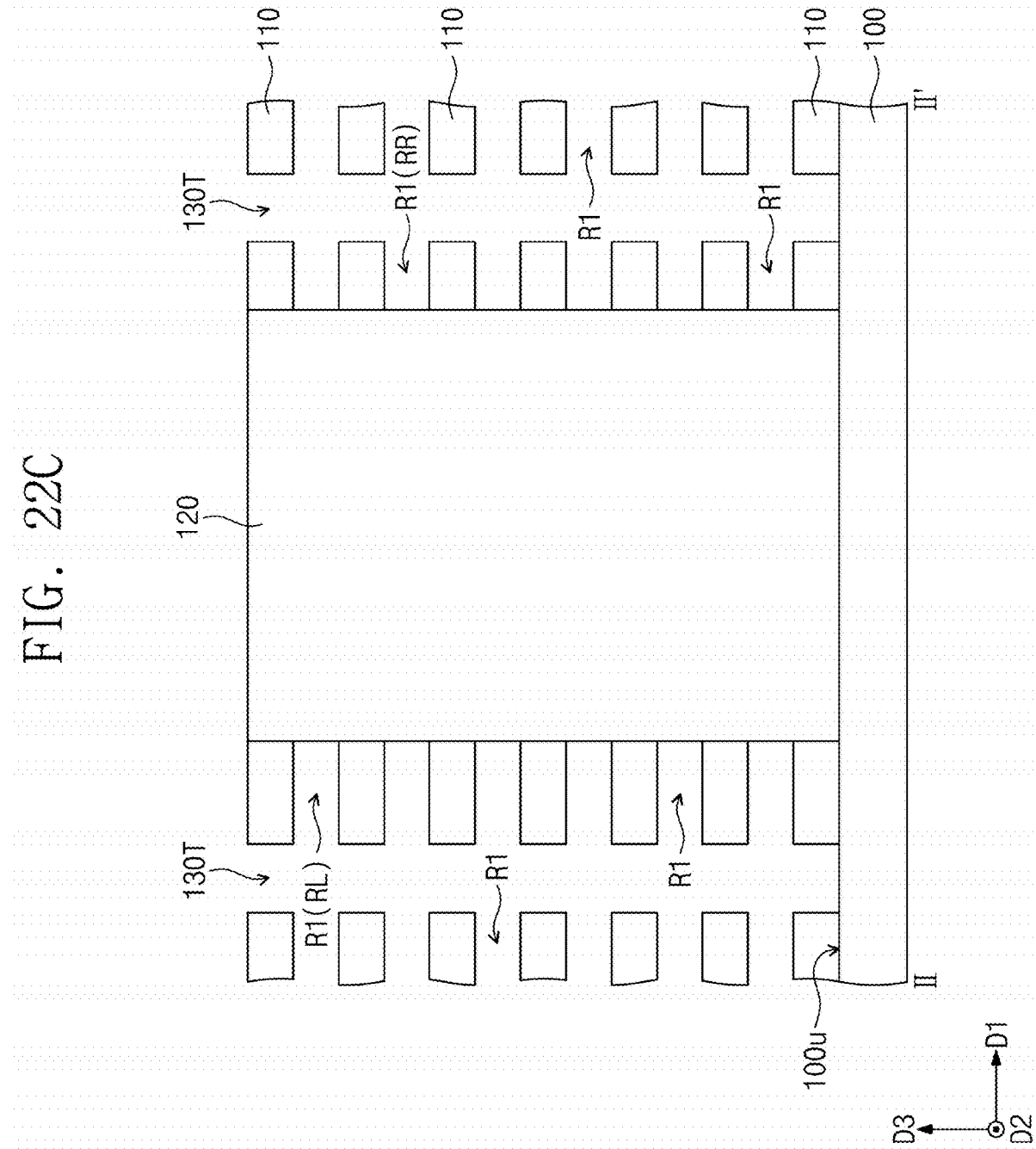

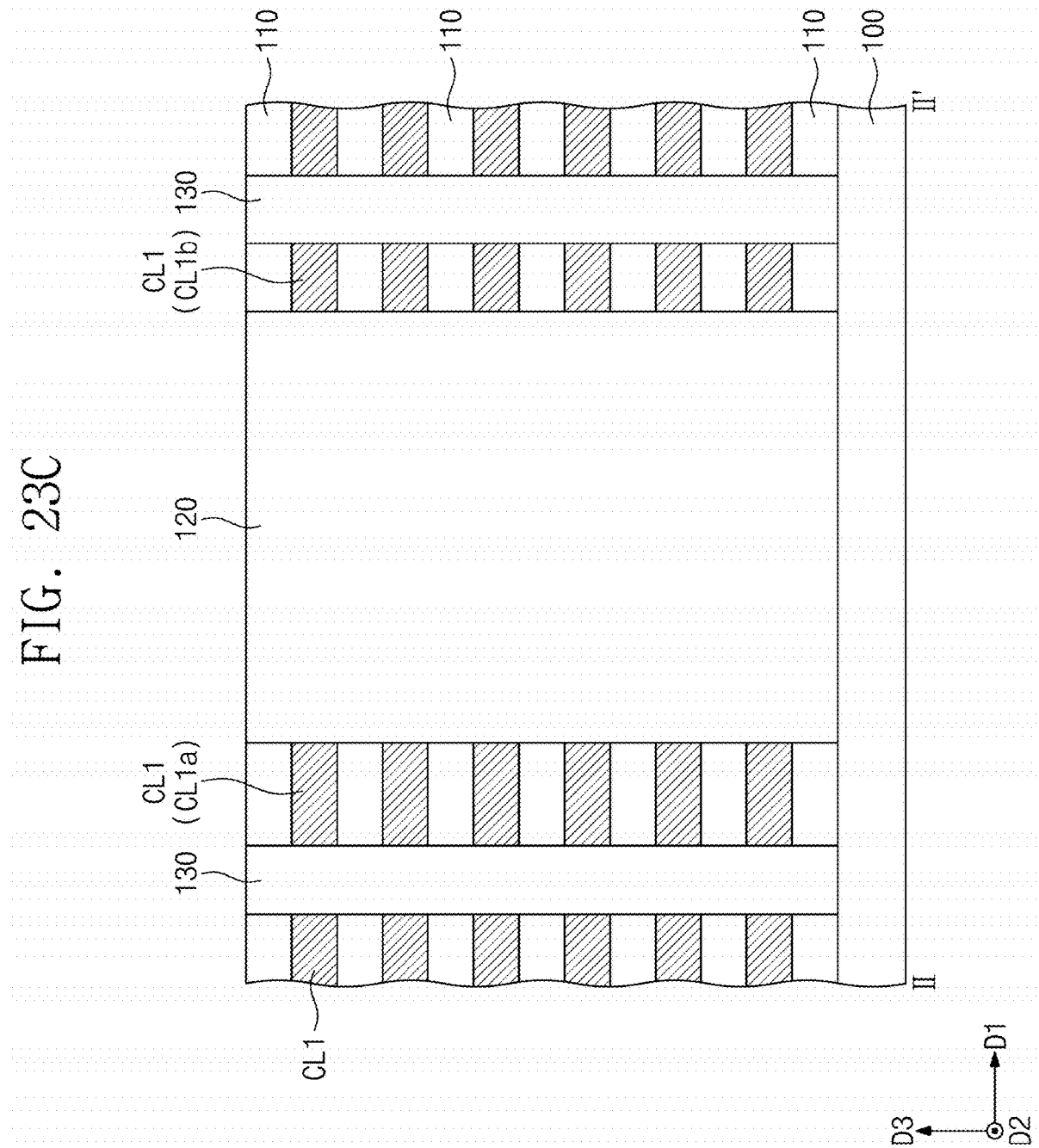

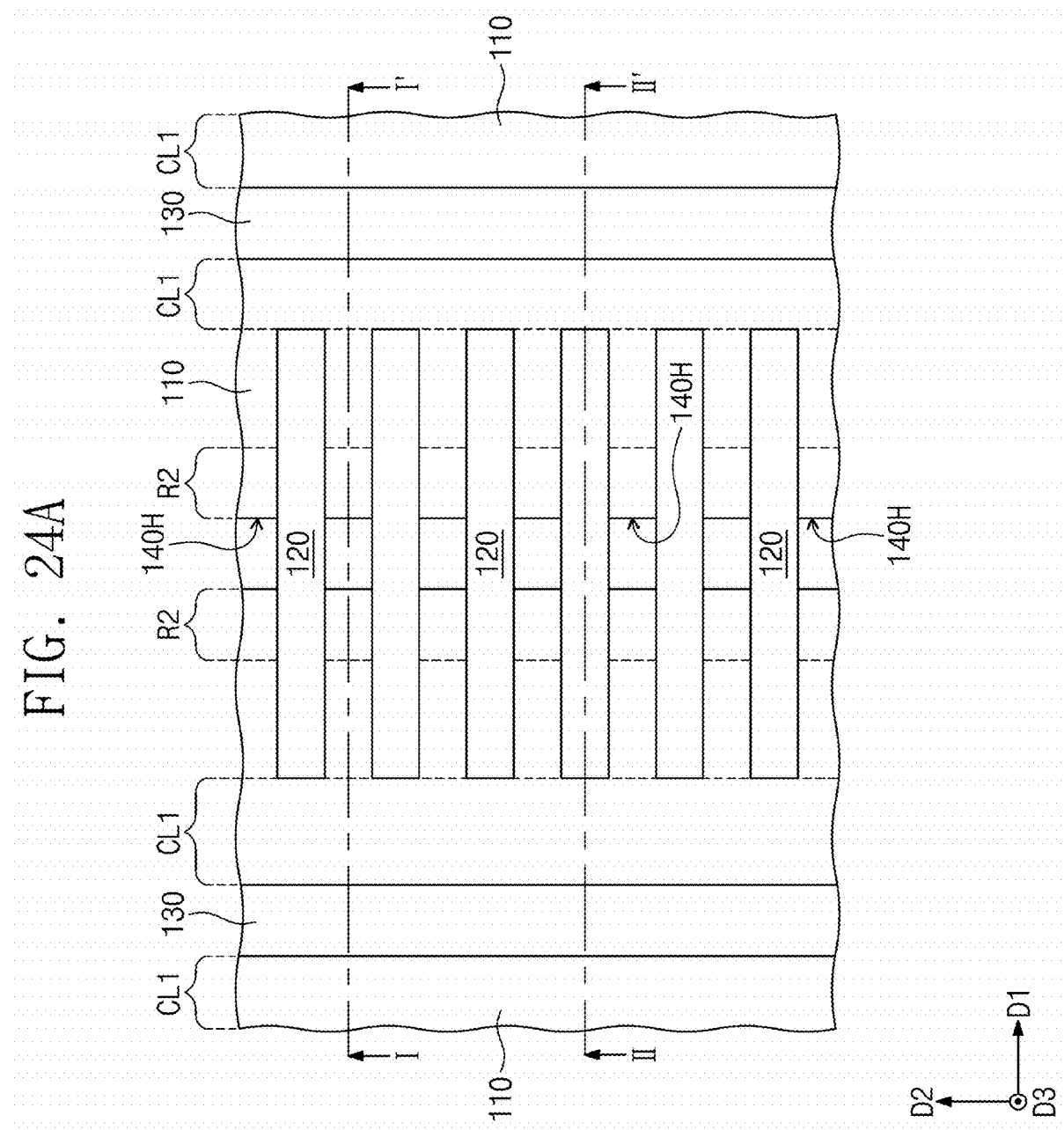

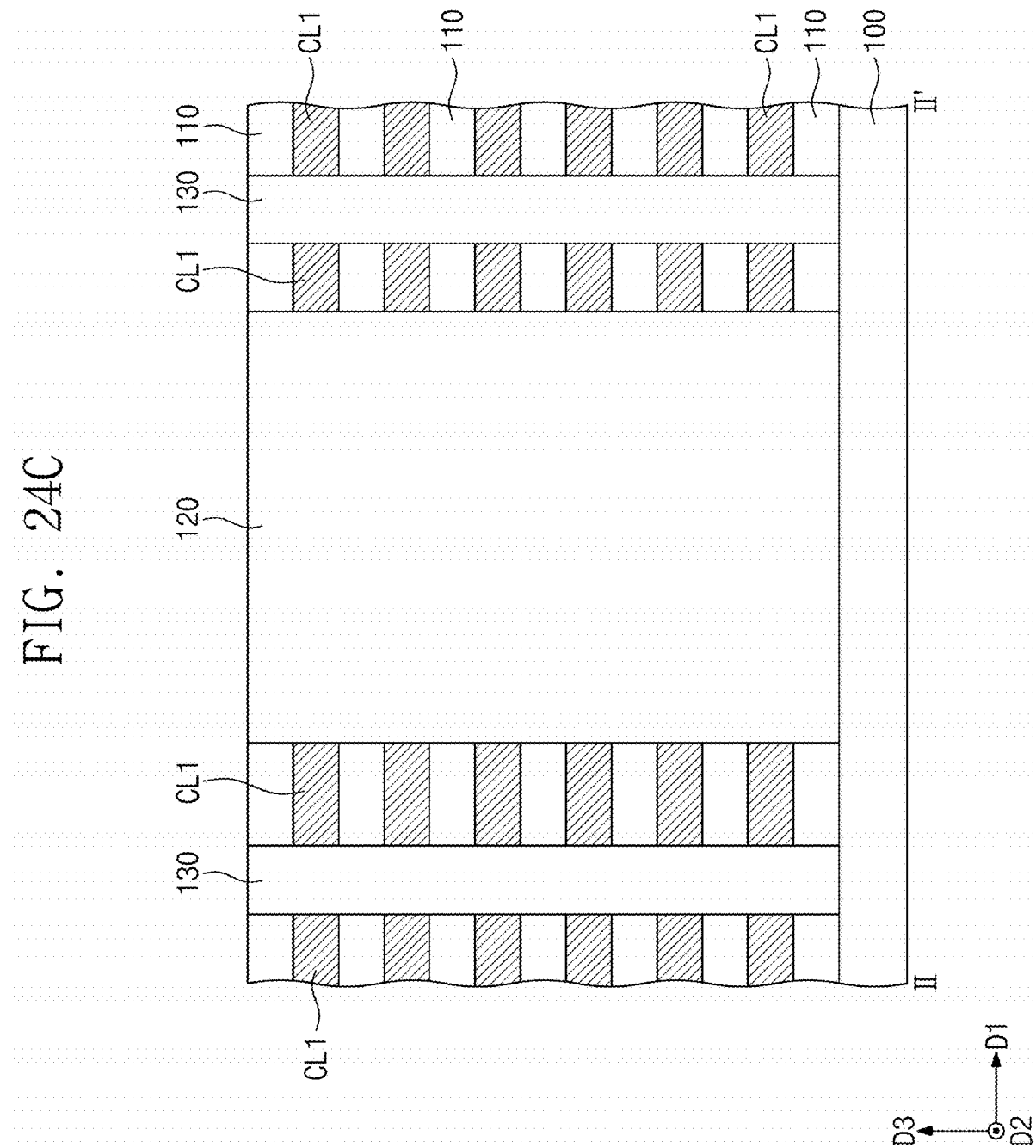

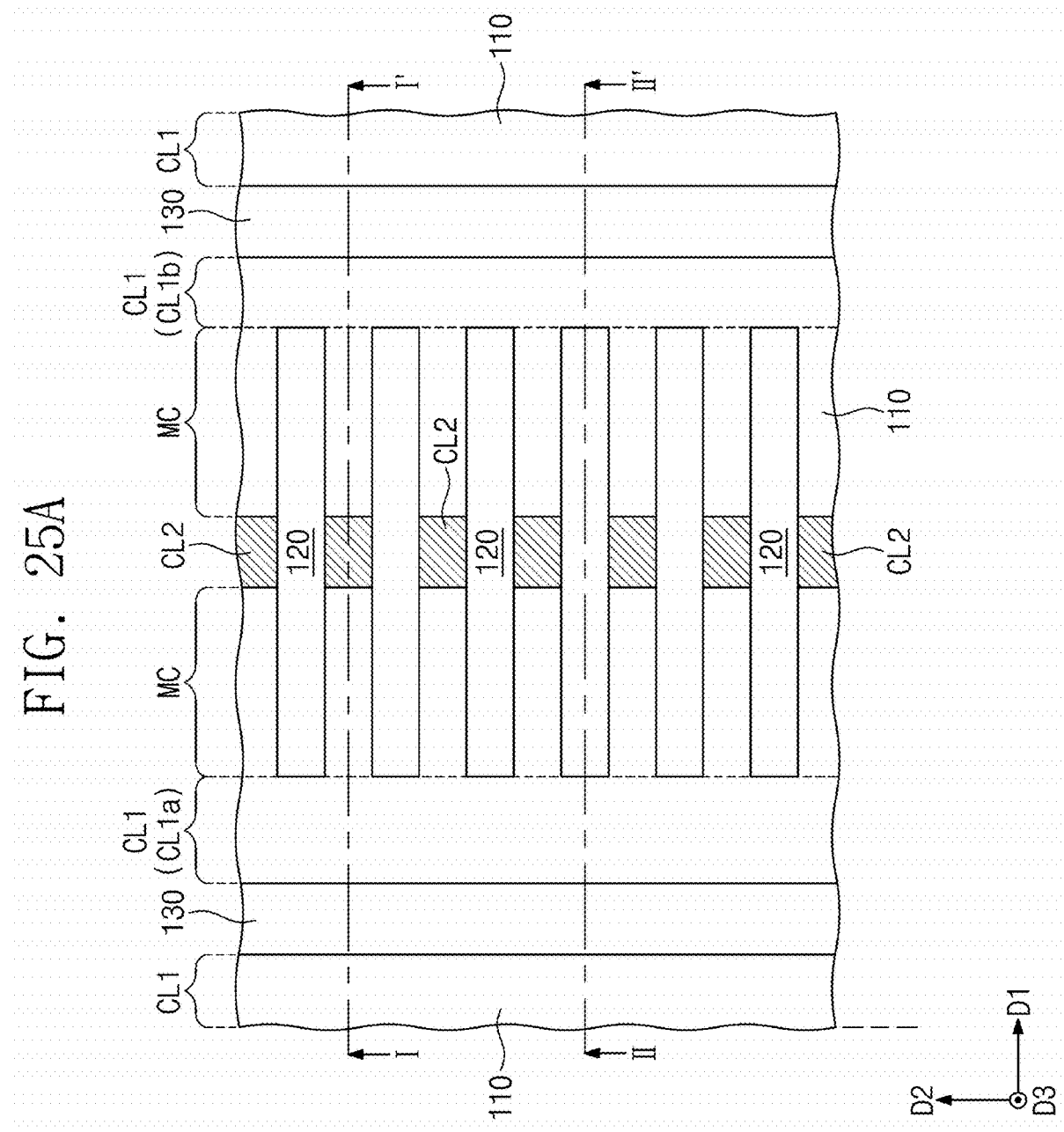

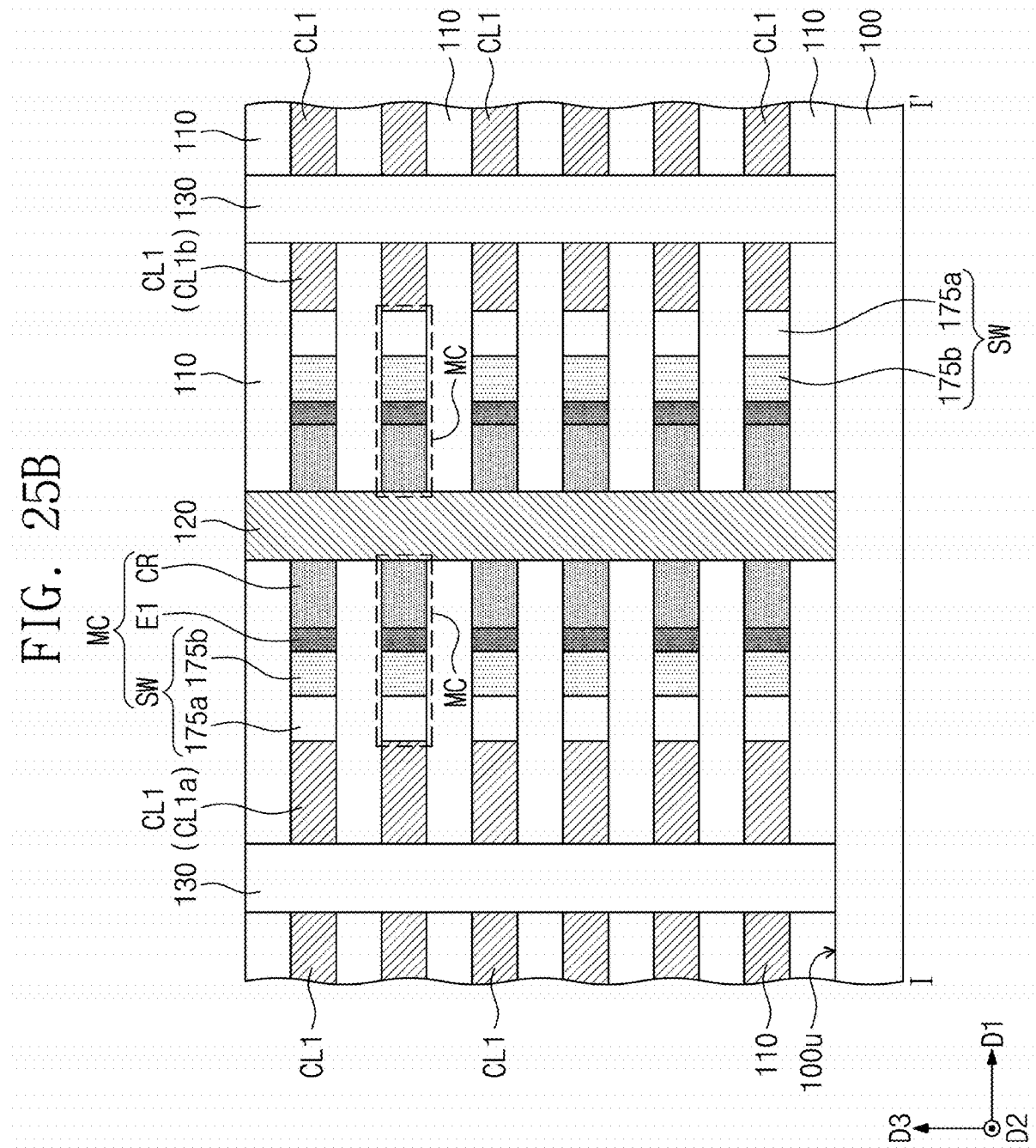

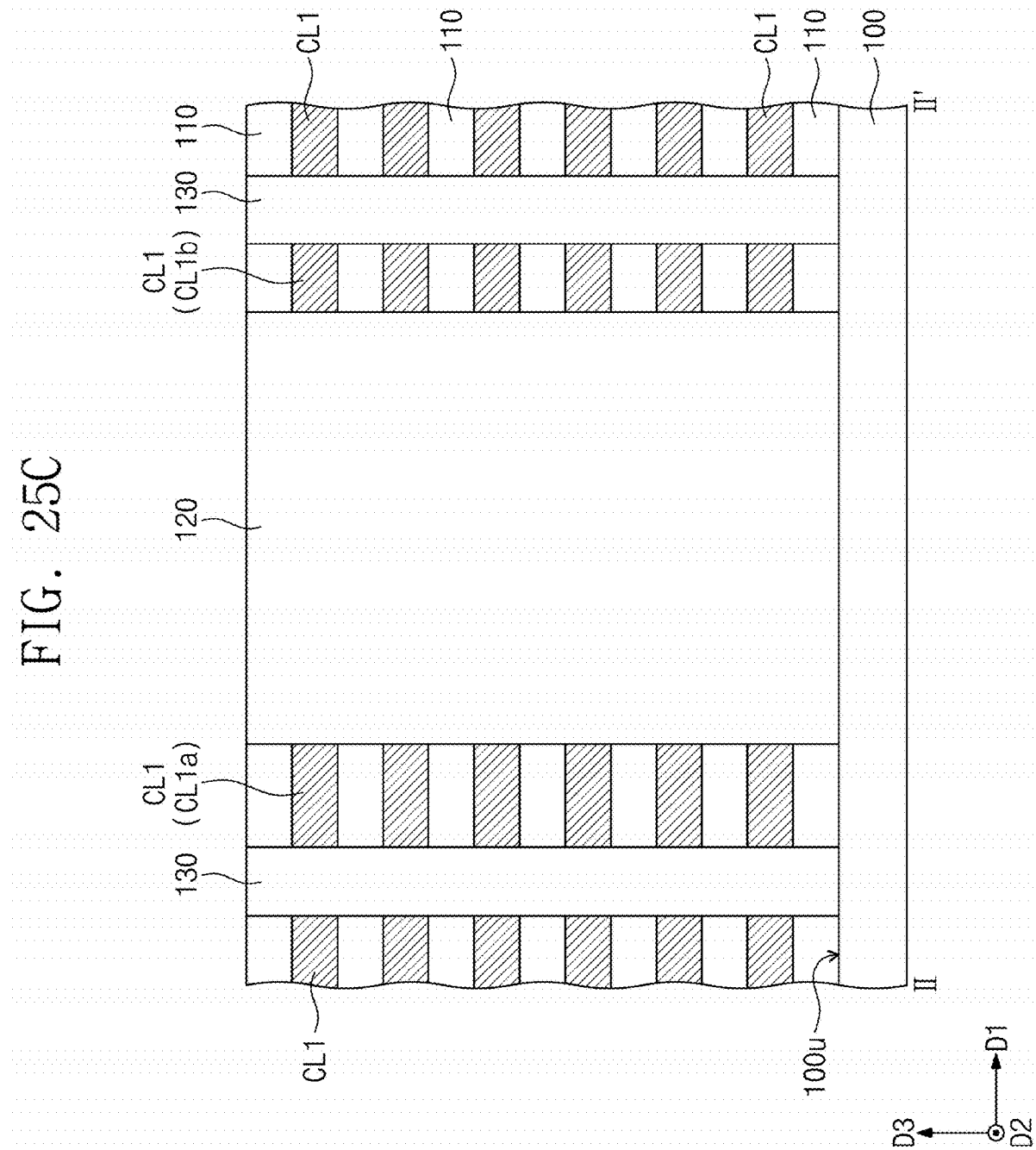

VARIABLE RESISTANCE MEMORY DEVICE

CROSS-REFERENCE TO RELATED APPLICATION

This U.S. non-provisional patent application claims priority under 35 U.S.C. § 119 to Korean Patent Application No. 10-2019-0008898, filed on Jan. 23, 2019, in the Korean Intellectual Property Office, the disclosure of which is hereby incorporated by reference in its entirety.

BACKGROUND

The present inventive concepts relate to semiconductor devices and, more particularly, to variable resistance memory devices.

Semiconductor devices may be categorized as any one of memory devices and logic devices. The memory devices may store logical data. Typically, semiconductor memory devices may be classified into volatile memory devices and non-volatile memory devices. Volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

SUMMARY

Some example embodiments of the present inventive concepts may provide a variable resistance memory device capable of improving electrical characteristics.

According to some example embodiments of the present inventive concepts, a variable resistance memory device may include memory cell stacks arranged in a first direction, the memory cell stacks including a first memory cell stack and a second memory cell stack, and each of the memory cell stacks includes a plurality of word lines, each word line of the plurality of word lines extending in a second direction intersecting the first direction and arranged in a third direction intersecting the first direction and the second direction, and a memory cell connected to the plurality of word lines, the memory cell including a switching element and a variable resistance element. Each of the plurality of word lines of the first memory cell stack have may have a first thickness, in the first direction, the first thickness being less than a second thickness, in the second direction, of each of the plurality of word lines of the second memory cell stack.

According to some example embodiments of the present inventive concepts, a variable resistance memory device may include memory cell stacks on a substrate, wherein the memory cell stacks include word lines having a thickness, in a first direction, and extending in a second direction and arranged in a third direction intersecting the second direction, the first direction intersecting the second and third directions, bit lines extending in the third direction and arranged in the second direction, and memory cells provided at intersection points of the word lines and the bit lines, wherein each of the memory cells includes a switching element and a variable resistance element. The thickness, in the first direction, of the word lines of at least one of the memory cell stacks may be different from thicknesses, in the first direction, of the word lines of other memory cell stacks.

According to some example embodiments of the present inventive concepts, a variable resistance memory device may include a substrate, and stack structures on a top surface of the substrate, arranged in a first direction, wherein each of the stack structures include word lines extending in a second direction parallel to the top surface of the substrate and arranged in a third direction perpendicular to the top surface of the substrate, the word lines including first sub-word lines, and second sub-word lines spaced apart from the first sub-word lines in the first direction, the first direction intersecting the second direction and the third direction, The bit lines may be between the first sub-word lines and the second sub-word lines and may be arranged in the second direction and memory cells at intersection points of the first sub-word lines and the bit lines and intersection points of the second sub-word lines and the bit lines, wherein each of the memory cells comprises a switching element and a variable resistance element. A thickness, in the first direction, of the word lines of at least one of the stack structures may be different from thicknesses, in the first direction, of the word lines of other stack structures.

BRIEF DESCRIPTION OF THE DRAWINGS

The inventive concepts will become more apparent in view of the attached drawings and accompanying detailed description.

FIG. 20 is a plan view illustrating arrangement of word lines, bit lines and memory cells of FIG. 17.

FIGS. 21A to 25A are plan views illustrating a method of manufacturing a variable resistance memory device, according to some example embodiments of the inventive concepts.

FIGS. 21B to 25B are cross-sectional views taken along lines I-I' of FIGS. 21A to 25A, respectively.

FIGS. 21C to 25C are cross-sectional views taken along lines II-II' of FIGS. 21A to 25A, respectively.

DETAILED DESCRIPTION OF EMBODIMENTS

Figure 1:
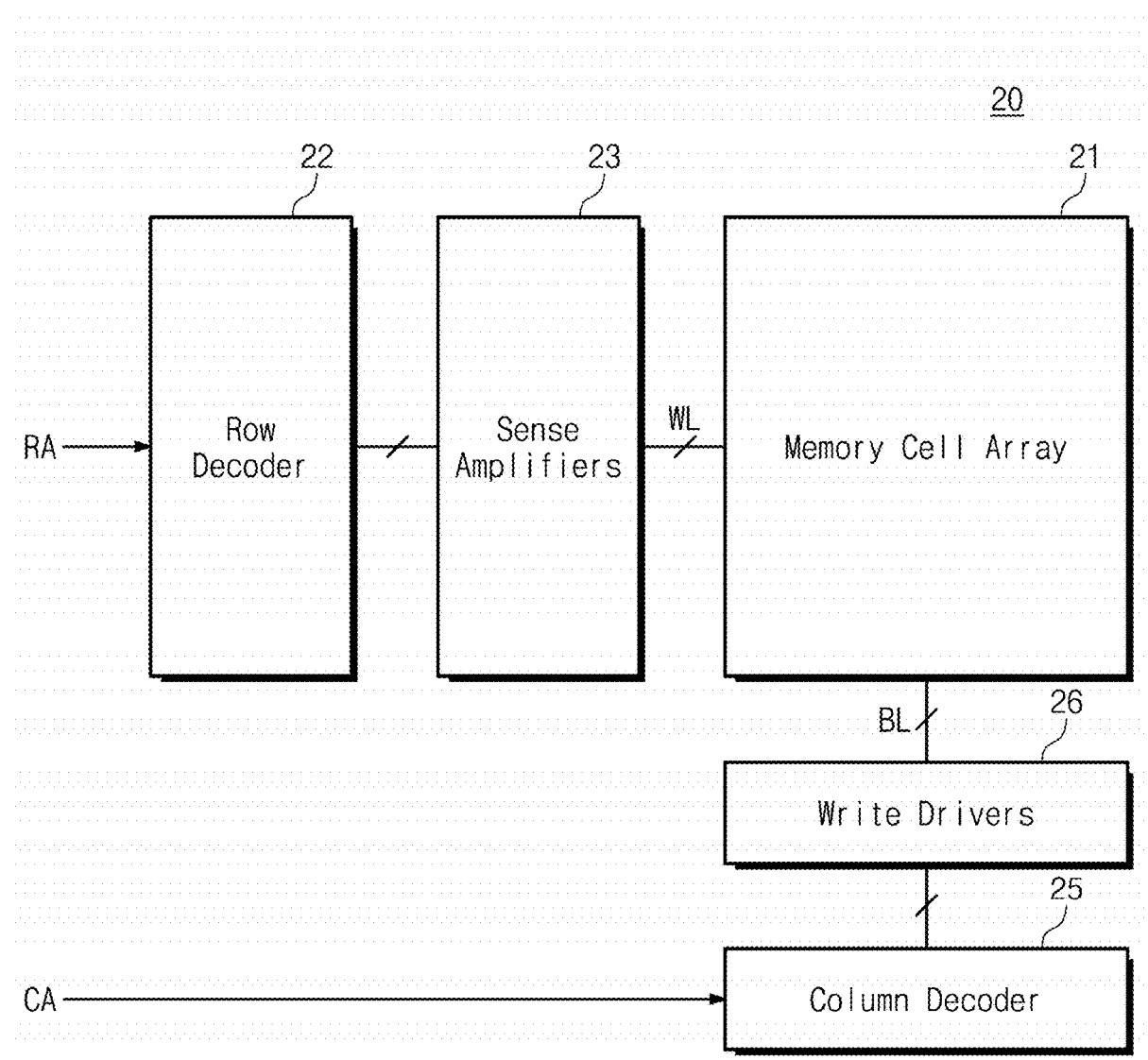
FIG. 1 is a block diagram illustrating a variable resistance memory device according to some example embodiments of the inventive concepts.

FIG. 1 is a block diagram illustrating a variable resistance memory device according to some example embodiments of the inventive concepts. A variable resistance memory device 20 may include a memory cell array 21, a row decoder 22, write drivers 26, sense amplifiers 23, and a column decoder 25.

The memory cell array 21 may include memory cells connected to word lines WL and bit lines BL. In some example embodiments, the memory cells of each row may be connected to one of the word lines WL. The memory cells of each column may be connected to one of the bit lines BL. The memory cell array 21 may correspond to at least one of memory cell stacks to be described later. The memory cell array 21 may include variable resistance memory cells, e.g., phase change memory cells.

The row decoder 22 may be connected to the memory cell array 21 through the sense amplifiers 23 and the word lines WL. The row decoder 22 may receive a row address signal RA. The row decoder 22 may select one among the word lines WL in response to the row address signal RA. The row decoder 22 may apply a selection voltage or a selection current to the selected word line and may apply non-selection voltages or non-selection currents to unselected word lines.

The sense amplifiers 23 may sense voltages or currents to read data from selected memory cells. In some example embodiments, the sense amplifiers 23 may perform a read operation on the selected memory cells to determine or check ranges of resistance values of the selected memory cells, thereby reading the data.

The write drivers 26 may be connected to the memory cell array 21 through the bit lines BL. The write drivers 26 may apply voltages or currents to the bit lines BL to write data into selected memory cells. In some example embodiments, the write drivers 26 may perform a set operation or a reset operation on the selected memory cells to change resistance values of the selected memory cells, thereby writing or erasing data.

The column decoder 25 may receive a column address signal CA. The column decoder 25 may select at least one among the bit lines BL in response to the column address signal CA. To achieve this, the column decoder 25 may select and control some write drivers 26.

Figure 2:
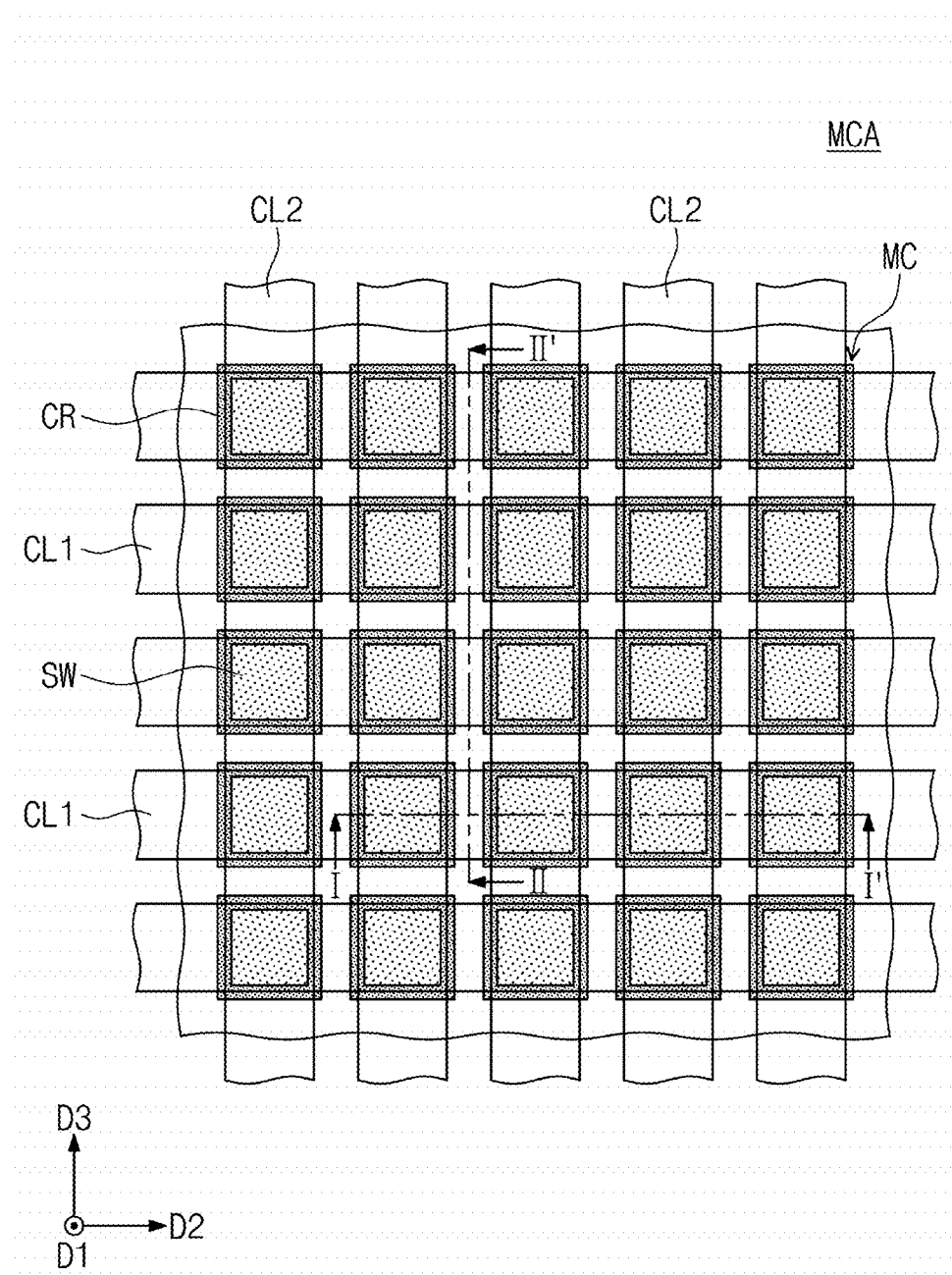
FIG. 2 is a plan view illustrating a variable resistance memory device according to some example embodiments of the inventive concepts.
Figure 3:
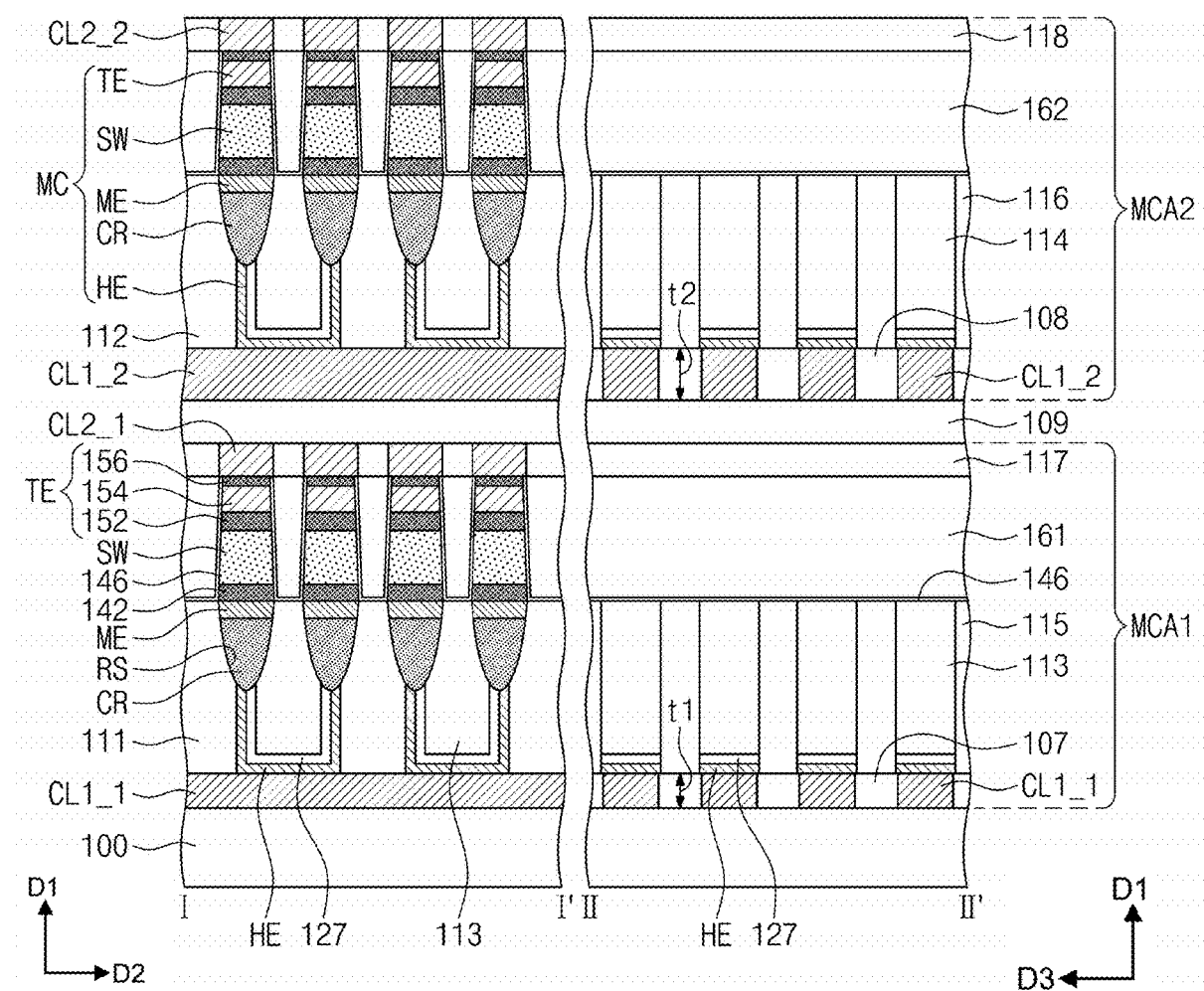
FIG. 3 is a cross-sectional view taken along lines I-I' and II-II' of FIG. 2.

FIG. 2 is a plan view illustrating a variable resistance memory device according to some example embodiments of the inventive concepts. FIG. 3 is a cross-sectional view taken along lines I-I' and II-II' of FIG. 2.

Referring to FIGS. 2 and 3, memory cell stacks MCA may be provided on a substrate 100. In some example embodiments, the memory cell stacks MCA may include a first memory cell stack MCA1 and a second memory cell stack MCA2 which are arranged or stacked in a first direction D1 perpendicular to a top surface of the substrate 100. Two memory cell stacks MCA are illustrated as an example for the purpose of ease and convenience in explanation. However, in certain example embodiments, three or more memory cell stacks MCA may be provided on the substrate 100.

Each of the memory cell stacks MCA may include word lines CL1 provided on the substrate 100, and bit lines CL2 provided on the word lines CL1. In some example embodiments, the first memory cell stack MCA1 may include first word lines CL1_1, first bit lines CL2_1, and memory cells MC between the first word lines CL1_1 and the first bit lines CL2_1. The word lines CL1 may be interconnection lines connected to the row decoder 22 as described with reference to FIG. 1. In some example embodiments, the word lines CL1 may be connected to the row decoder 22 through the sense amplifiers 23. The bit lines CL2 may be interconnection lines connected to the column decoder 25. In some example embodiments, the bit lines CL2 may be connected to the column decoder 25 through the write drivers 26.

Hereinafter, the first memory cell stack MCA1 will be described in more detail. The first word lines CL1_1 may extend in a second direction D2 intersecting the first direction D1 and may be arranged in a third direction D3 intersecting the first and second directions D1 and D2. The second direction D2 and the third direction D3 may be directions parallel to the top surface of the substrate 100. The first bit lines CL2_1 may extend in the third direction D3 and may be arranged in the second direction D2.

The first word lines CL1_1 and the first bit lines CL2_1 may include a conductive material such as copper or aluminum. The first word lines CL1_1 and the first bit lines CL2_1 may further include a conductive metal nitride such as TiN or WN.

The memory cells MC may be disposed at intersection points of the first word lines CL1_1 and the first bit lines CL2_1, respectively. Each of the memory cells MC may include a variable resistance element CR and a switching element SW. Each of the memory cells MC may further include an intermediate electrode ME between the variable resistance element CR and the switching element SW. The variable resistance element CR may be provided between the switching element SW and the substrate 100. Alternatively, the switching element SW may be provided between the variable resistance element CR and the substrate 100. Hereinafter, an example embodiment in which the variable resistance element CR is provided between the first word line CL1_1 and the switching element SW will be described for the purpose of ease and convenience in explanation. However, example embodiments of the inventive concepts are not limited thereto.

The first word lines CL1_1 may be provided in a lower interlayer insulating layer 107. The variable resistance elements CR may be provided in recess regions RS formed in first to third interlayer insulating layers 111, 113 and 115 on the first word lines CL1_1. In some example embodiments, the first to third interlayer insulating layers 111, 113 and 115 may include silicon nitride or silicon oxynitride. The recess regions RS may be respectively disposed at the intersection points of the first word lines CL1_1 and the first bit lines CL2_1 and thus may be two-dimensionally arranged, when viewed in a plan view. Alternatively, the variable resistance elements CR may have line shapes extending in the second direction D2 or the third direction D3.

The variable resistance elements CR may be formed of at least one of materials having properties capable of storing logical data. When the variable resistance memory device according to some example embodiments of the inventive concepts is a phase change memory device, the variable resistance elements CR may include a material of which a phase is reversibly changeable between a crystalline phase and an amorphous phase by a temperature. In some example embodiments, a phase transition temperature between the crystalline and amorphous phases of the variable resistance elements CR may range from about 250 degrees Celsius to about 350 degrees Celsius. The variable resistance elements CR may be formed of a compound that includes at least one of Te or Se (i.e., chalcogenide elements) and at least one of Ge, Sb, Bi, Pb, Sn, Ag, As, S, Si, In, Ti, Ga, P, O, or C. In some example embodiments, the variable resistance elements CR may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. In certain example embodiments, the variable resistance elements CR may have a superlattice structure in which layers including Ge and layers not including Ge are repeatedly and alternately stacked. In some example embodiments, the variable resistance elements CR may have a structure in which GeTe layers and SbTe layers are repeatedly and alternately stacked.

Heater electrodes HE may be provided between the first word lines CL1_1 and the variable resistance elements CR. Each of the heater electrodes HE may connect a pair of the variable resistance elements CR, adjacent to each other in the second direction D2, to the first word line CL1_1. In some example embodiments, each of the heater electrodes HE may include a horizontal portion connected to the first word line CL1_1, and a pair of vertical portions extending from both end portions of the horizontal portion to the pair of variable resistance elements CR, respectively. Alternatively, the heater electrodes HE may be respectively disposed at the intersection points of the first word lines CL1_1 and the first bit lines CL2_1 and thus may be two-dimensionally arranged.

The heater electrodes HE may heat the variable resistance elements CR to change the phases of the variable resistance elements CR. The heater electrodes HE may be formed of a material of which a resistivity is greater than that of the first word lines CL1_1. In some example embodiments, the heater electrodes HE may include at least one of W, Ti, Al, Cu, C, CN, TiN, TiAlN, TiSiN, TiCN, WN, CoSiN, WSiN, TaN, TaCN, TaSiN, or TiO.

A spacer pattern 127 may be provided between each of the heater electrodes HE and the second interlayer insulating layer 113. The spacer pattern 127 may extend along the horizontal portion and the vertical portions of the heater electrode HE. In some example embodiments, the spacer pattern 127 may include silicon oxide and/or silicon oxynitride.

Lower portions of the recess regions RS may be occupied by the variable resistance elements CR, and upper portions of the recess regions RS may be occupied by the intermediate electrodes ME. The intermediate electrodes ME may electrically connect the variable resistance elements CR and the switching elements SW and may prevent the variable resistance elements CR from being in direct contact with the switching elements SW. In some example embodiments, the intermediate electrodes ME may include at least one of W, Ti, Al, Cu, C, CN, TiN, TiAlN, TiSiN, TiCN, WN, CoSiN, WSiN, TaN, TaCN, or TaSiN. Top surfaces of the first to third interlayer insulating layers 111, 113 and 115 may be substantially coplanar with top surfaces of the intermediate electrodes ME. Alternatively, the intermediate electrodes ME may be provided on the first to third interlayer insulating layers 111, 113 and 115.

Each of the switching elements SW may include an ovonic threshold switch (OTS) element having a bi-directional characteristic. In some example embodiments, each of the switching elements SW may include an element based on a threshold switching phenomenon having a nonlinear I-V curve (e.g., an S-shaped I-V curve). The switching elements SW may have a phase transition temperature between crystalline and amorphous phases, which is higher than that of the variable resistance elements CR. In some example embodiments, the phase transition temperature of the switching elements SW may range from about 350 degrees Celsius to about 450 degrees Celsius. Thus, when the variable resistance memory device according to the example embodiments of the inventive concepts is operated, the phases of the variable resistance elements CR may be reversibly changed between the crystalline and amorphous phases by an operating voltage (e.g., a program voltage), but the switching elements SW may be maintained in a substantially amorphous state without a phase change even though the operating voltage is applied thereto. In the present specification, the term 'substantially amorphous state' may include an amorphous state and may also include a case in which a grain boundary or a crystallized portion locally exists in a portion of a component.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The switching elements SW may be formed of a compound that includes at least one of Te or Se (e.g., chalcogenide elements) and at least one of Ge, Sb, Bi, Al, Pb, Sn, Ag, As, S, Si, In, Ti, Ga, or P. The switching elements SW may further include a thermal stabilization element in addition to the compound. The thermal stabilization element may include at least one of C, N, or O.

Bottom carbon electrode patterns 142 may be provided between the switching elements SW and the intermediate electrodes ME. In some example embodiments, the bottom carbon electrode patterns 142 may include a conductive material including carbon.

Top electrodes TE may be provided between the switching elements SW and the first bit lines CL2_1. The top electrodes TE may be disposed on the switching elements SW, respectively, and may be separated from each other. In other words, the top electrodes TE may be two-dimensionally arranged along rows and columns. Alternatively, each of the top electrodes TE may be connected in common to the switching elements SW arranged in the third direction D3.

The first bit lines CL2_1 may be provided on the top electrodes TE. The first bit lines CL2_1 may be spaced apart from each other in the second direction D2 by a second insulating layer 117. In some example embodiments, the second insulating layer 117 may include silicon oxide or silicon oxynitride. The second insulating layer 117 may include a plurality of insulating patterns separated from each other by the first bit lines CL2_1. A first insulating layer 161 may be provided to fill a space between the switching elements SW. In some example embodiments, the first insulating layer 161 may include silicon oxide or silicon oxynitride.

The top electrode TE may include a first carbon electrode pattern 152, a metal pattern 154, and a second carbon electrode pattern 156, which are sequentially stacked. The first and second carbon electrode patterns 152 and 156 may include a conductive material including carbon. The metal pattern 154 may include at least one of W, Ti, Al, Cu, C, CN, TiN, TiAlN, TiSiN, TiCN, WN, CoSiN, WSiN, TaN, TaCN, or TaSiN. In some example embodiments, the first carbon electrode pattern 152 may be thicker than the second carbon electrode pattern 156. Alternatively, at least one of the first carbon electrode pattern 152, the metal pattern 154 and the second carbon electrode pattern 156 may be omitted in the top electrode TE.

A sidewall insulating layer 146 may be provided between the first insulating layer 161 and the switching elements SW. The sidewall insulating layer 146 may extend under a bottom surface of the first insulating layer 161. In some example embodiments, the sidewall insulating layer 146 may extend between the first insulating layer 161 and the first to third interlayer insulating layers 111, 113 and 115. The sidewall insulating layer 146 may extend onto sidewalls of the top electrodes TE. In some example embodiments, a topmost surface of the sidewall insulating layer 146 may be substantially coplanar with top surfaces of the top electrodes TE. The sidewall insulating layer 146 may not include oxygen. The sidewall insulating layer 146 may include a material of which a dielectric constant is greater than that of the first insulating layer 161. In some example embodiments, the sidewall insulating layer 146 may include a silicon nitride layer.

The second memory cell stack MCA2 may be spaced apart from the first memory cell stack MCA1 with a third insulating layer 109 interposed therebetween. In some example embodiments, the third insulating layer 109 may include a silicon oxide layer. The second memory cell stack MCA2 may have substantially the same structure as the first memory cell stack MCA1. In some example embodiments, the second memory cell stack MCA2 may include second word lines CL1_2, second bit lines CL2_2, and memory cells MC between the second word lines CL1_2 and the second bit lines CL2_2. The second word lines CL1_2 may be disposed in a lower interlayer insulating layer 108. The memory cells MC may be disposed in first to third interlayer insulating layers 112, 114 and 116 and a first insulating layer 162. The second bit lines CL2_2 may be disposed in a second insulating layer 118.

A thickness, in the first direction D1, of the word lines of at least one of the memory cell stacks MCA may be different from that of the word lines of other(s) of the memory cell stacks MCA. In some example embodiments, a second thickness t2, in the first direction D1, of the second word lines CL1_2 of the second memory cell stack MCA2 may be greater than a first thickness t1, in the first direction D1, of the first word lines CL1_1 of the first memory cell stack MCA1. In some example embodiments, the second thickness t2 may range from about 1.3 times to about 3 times the first thickness t1.

A thickness of the first bit lines CL2_1 may be substantially equal to a thickness of the second bit lines CL2_2. In some example embodiments, the thickness of the first bit lines CL2_1 and the thickness of the second bit lines CL2_2 may be substantially equal to the first thickness t1 of the first word lines CL1_1.

Figure 4:
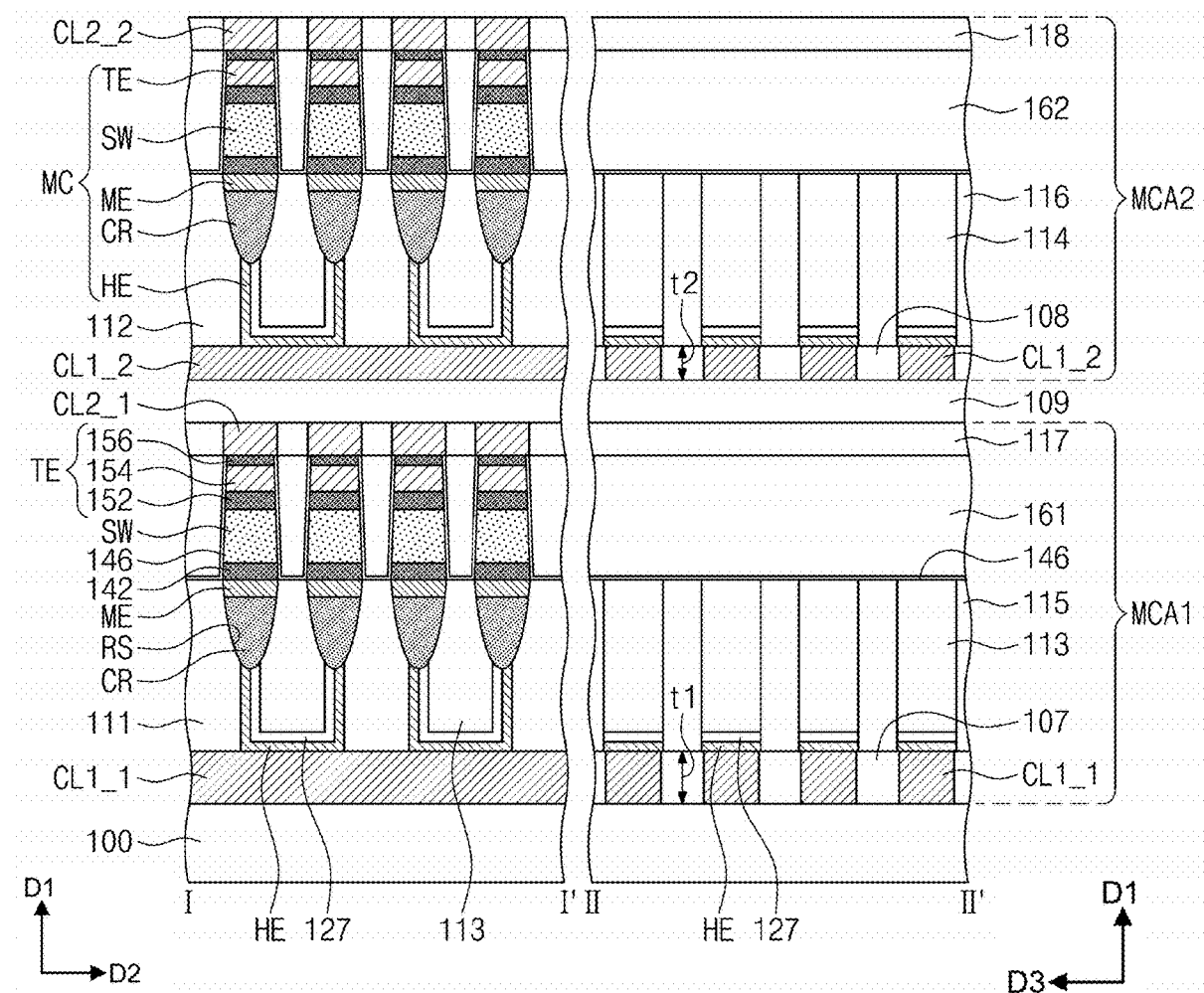
FIG. 4 is a cross-sectional view taken along the lines I-I' and II-II' of FIG. 2 to illustrate a variable resistance memory device according to some example embodiments of the inventive concepts.

FIG. 4 is a cross-sectional view taken along the lines I-I' and II-II' of FIG. 2 to illustrate a variable resistance memory device according to some example embodiments of the inventive concepts. In the present example embodiment, the second thickness t2, in the first direction D1, of the second word lines CL1_2 of the second memory cell stack MCA2 may be less than the first thickness t1, in the first direction D1, of the first word lines CL1_1 of the first memory cell stack MCA1. In some example embodiments, the first thickness t1 may range from about 1.3 times to about 3 times the second thickness t2.

The thickness of the word lines CL1 may be in proportion to a capacitance between the word lines CL1 of the corresponding memory cell stack MCA. When the variable resistance memory device according to some embodiments is operated, a snap back phenomenon may occur. The snap back phenomenon may generate a sudden negative resistance under a specific condition. The variable resistance memory device of the inventive concepts may be maintained in an off state at a voltage lower than a critical voltage and may be snapped back to an on state in response to a voltage higher than the critical voltage. The variable resistance memory device in the on state may rapidly flow a current using a characteristic maintaining a voltage at, e.g., a holding voltage level. Thus, a certain voltage may be dropped at a high speed.

The snap back phenomenon may cause an over current to flow through the variable resistance element CR, thereby causing a read disturbance. In other words, when the variable resistance element CR in a set state is read, the over current may instantaneously flow through the variable resistance element CR to cause a reset write operation. This snap back phenomenon may be affected by the capacitance between the word lines CL1 of the corresponding memory cell stack MCA. In other words, when the capacitance between the word lines CL1 is great, the snap back phenomenon may be mitigated. When the capacitance is small, the snap back phenomenon may be enhanced.

According to some example embodiments of the inventive concepts, the snap back phenomenon may be controlled by adjusting the thicknesses of the word lines of the memory cell stacks. In other words, the snap back phenomenon may be mitigated by increasing the thickness of the word lines, or the snap back phenomenon may be enhanced by reducing the thickness of the word lines. Thus, electrical characteristics of the variable resistance memory device may be improved.

Figure 5:
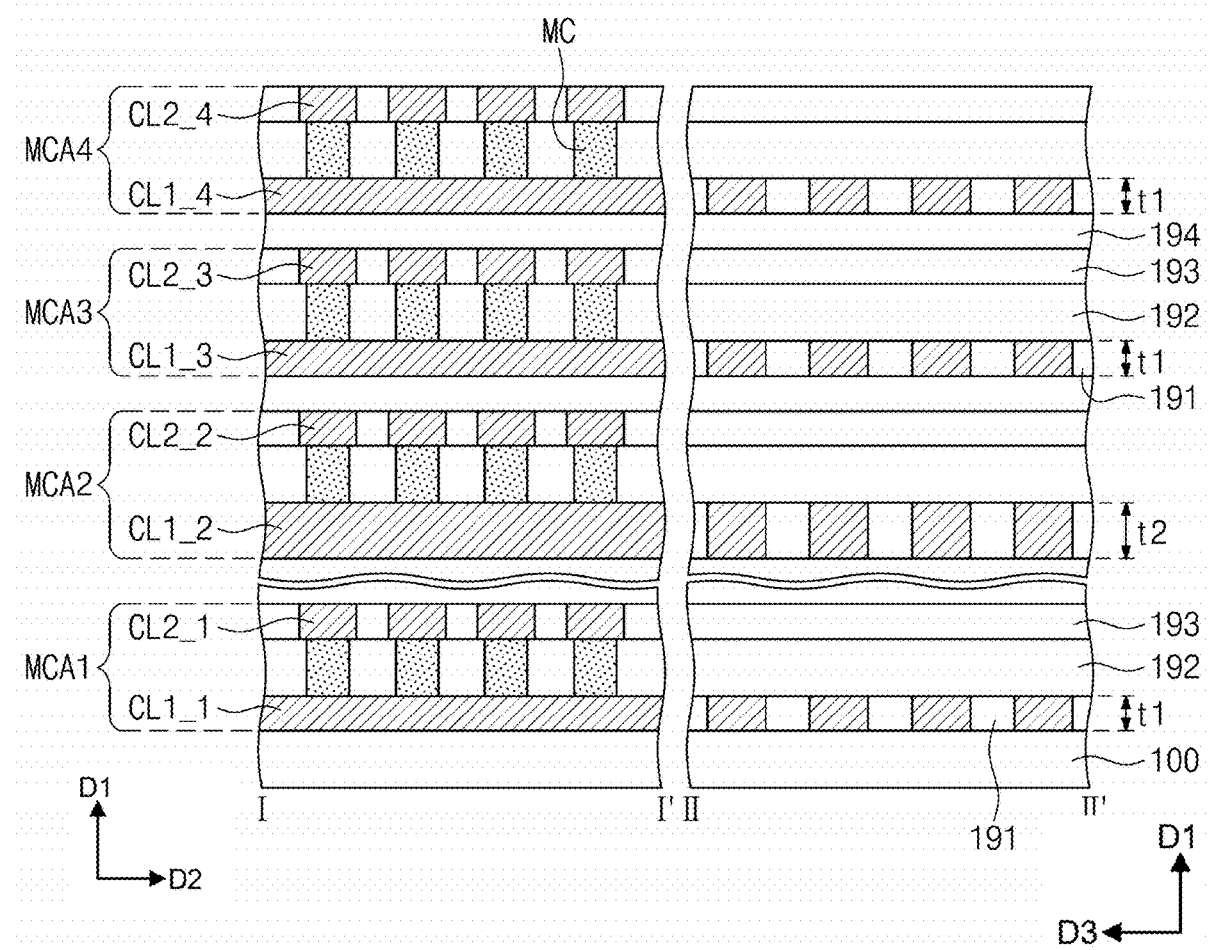
FIGS. 5 and 6 are cross-sectional views taken along the lines I-I' and II-II' of FIG. 2 to illustrate variable resistance memory devices according to some example embodiments of the inventive concepts.
Figure 6:
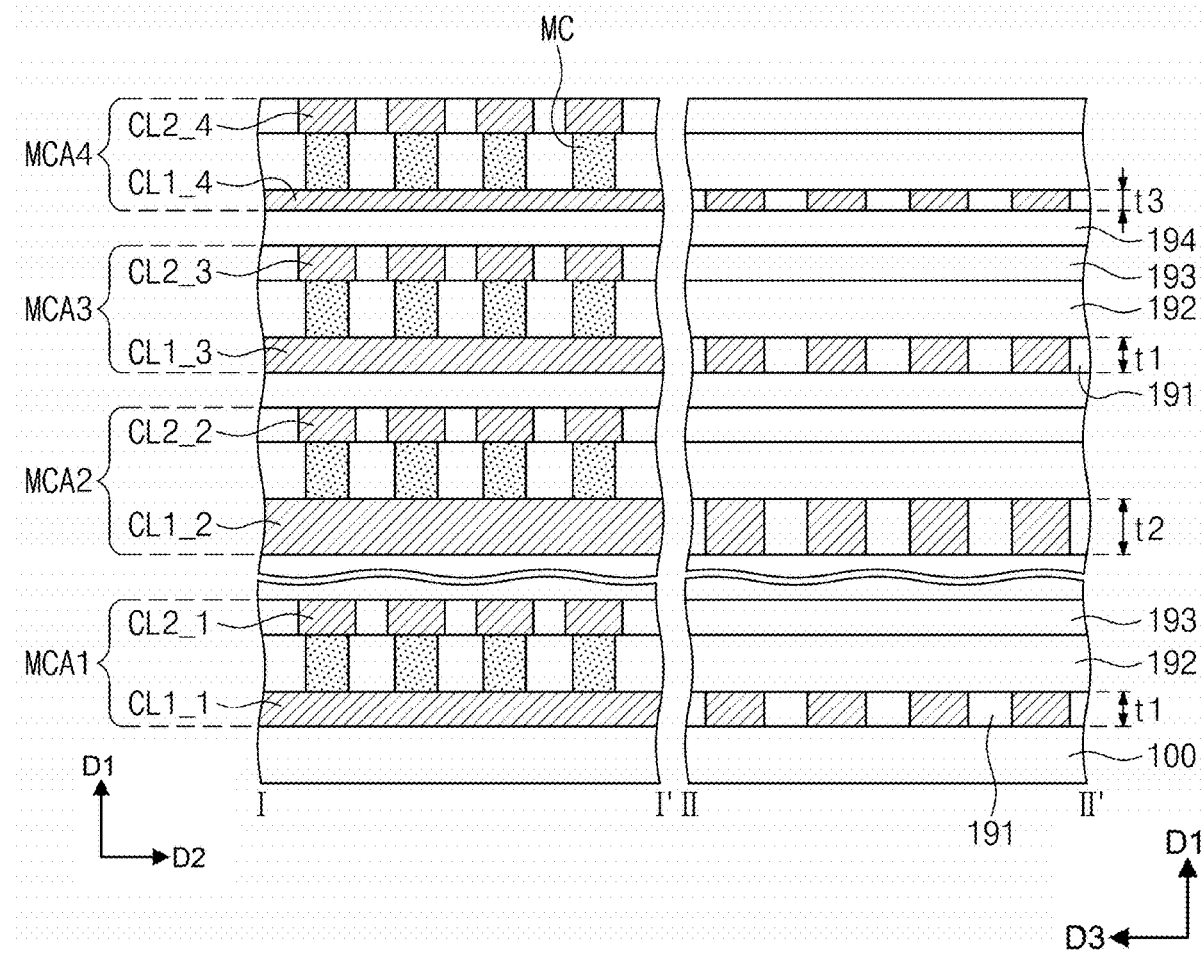

FIGS. 5 and 6 are cross-sectional views taken along the lines I-I' and II-II' of FIG. 2 to illustrate variable resistance memory devices according to some example embodiments of the inventive concepts. Hereinafter, the descriptions to the same components as in the above example embodiments will be omitted or mentioned briefly for the purpose of ease and convenience in explanation.

Referring to FIG. 5, a variable resistance memory device according to the present example embodiment may include first to fourth memory cell stacks MCA1 to MCA4 sequentially stacked on a substrate 100. The first to fourth memory cell stacks MCA1 to MCA4 may be spaced apart from each other with third insulating layers 194 interposed therebetween. Each of the first to fourth memory cell stacks MCA1 to MCA4 may include insulating layers 191, 192 and 193.

Four memory cell stacks are illustrated in FIG. 5. However, example embodiments of the inventive concepts are not limited thereto. In certain example embodiments, five or more memory cell stacks may be provided. The first to fourth memory cell stacks MCA1 to MCA4 may include first to fourth word lines CL1_1 to CL1_4 and first to fourth bit lines CL2_1 to CL2_4, respectively.

A second thickness t2 of the second word lines CL1_2 may be greater than a first thickness t1 of the word lines of other memory cell stacks MCA1, MCA3 and MCA4. The second thickness t2 may be greater than an average value of the thicknesses of other word lines. Thicknesses of the first to fourth bit lines CL2_1 to CL2_4 may be equal to each other. The thicknesses of the first to fourth bit lines CL2_1 to CL2_4 may be substantially equal to the first thickness t1. In certain example embodiments, two or more memory cell stacks having the second thickness t2 may be provided, and/or two or more memory cell stacks having the first thickness t1 may be provided.

Referring to FIG. 6, the second thickness t2 of the second word lines CL1_2 may be greater than the first thickness t1 of the word lines of other memory cell stacks MCA1 and MCA3. A third thickness t3 of fourth word lines CL1_4 may be less than the first thickness t1. The second thickness t2 of the second word lines CL1_2 may be greater than an average value of the thicknesses of other word lines, and the third thickness t3 of the fourth word lines CL1_4 may be less than an average value of the thicknesses of other word lines. In certain example embodiments, the memory cell stack having the second thickness t2 may be provided in plurality, and/or the memory cell stack having the third thickness t3 may be provided in plurality.

FIGS. 7 to 10 are cross-sectional views taken along the lines I-I' and II-II' of FIG. 2 to illustrate a method of manufacturing a variable resistance memory device, according to some example embodiments of the inventive concepts.

Figure 7:
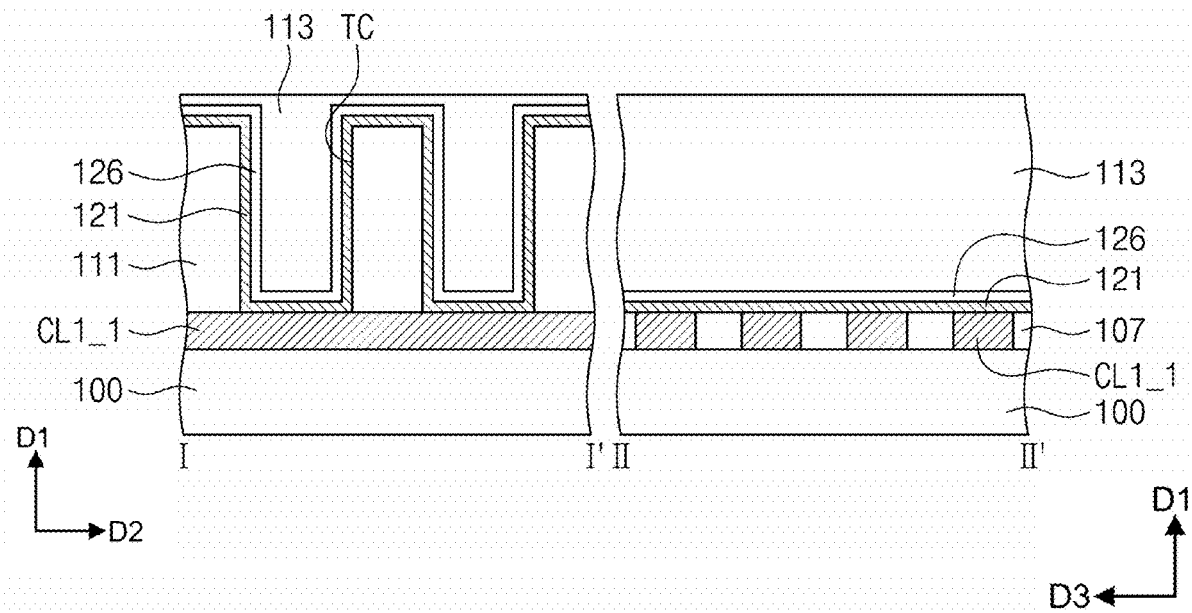
FIGS. 7 to 10 are cross-sectional views taken along the lines I-I' and II-II' of FIG. 2 to illustrate a method of manufacturing a variable resistance memory device, according to some example embodiments of the inventive concepts.

Referring to FIGS. 2 and 7, first word lines CL1_1 may be formed on a substrate 100. The first word lines CL1_1 may be provided in a lower interlayer insulating layer 107. A first interlayer insulating layer 111 may be formed on the first word lines CL1_1, and then, trenches TC may be formed in the first interlayer insulating layer 111. The formation of the trenches TC may include an anisotropic etching process. Each of the trenches TC may intersect the first word lines CL1_1. In some example embodiments, the first interlayer insulating layer 111 may be formed of silicon nitride or silicon oxynitride.

An electrode layer 121 and a spacer layer 126 may be sequentially formed on the first interlayer insulating layer 111 having the trenches TC. The electrode layer 121 and the spacer layer 126 may be conformally formed along shapes or profiles of the trenches TC. In some example embodiments, the electrode layer 121 may include at least one of W, Ti, Al, Cu, C, CN, TiN, TiAlN, TiSiN, TiCN, WN, CoSiN, WSiN, TaN, TaCN, TaSiN, or TiO. In some example embodiments, the spacer layer 126 may include at least one of silicon oxide or silicon oxynitride. A second interlayer insulating layer 113 filling the trenches TC may be formed on the spacer layer 126. In some example embodiments, the second interlayer insulating layer 113 may be formed of the same material as the first interlayer insulating layer 111.

Figure 8:
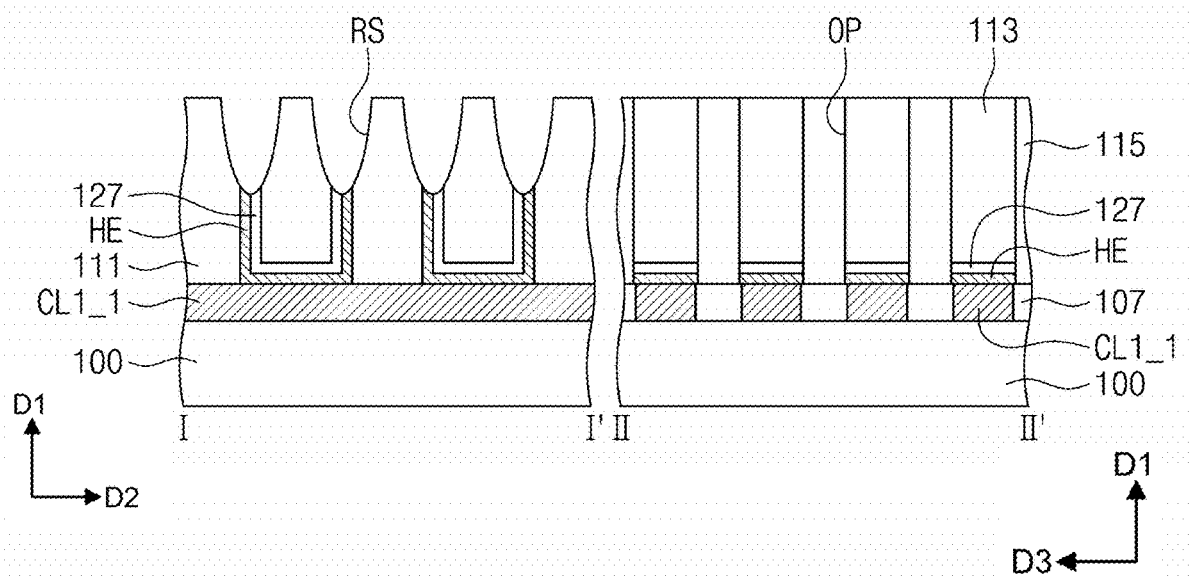

Referring to FIGS. 2 and 8, a planarization process may be performed until the first interlayer insulating layer 111 is exposed. Thereafter, the second interlayer insulating layer 113, the spacer layer 126 and the electrode layer 121 may be etched to form opening regions OP. As a result, heater electrodes HE may be formed from the electrode layer 121, and spacer patterns 127 may be formed from the spacer layer 126. Thereafter, a third interlayer insulating layer 115 may be formed to fill the opening regions OP. In some example embodiments, the third interlayer insulating layer 115 may be formed of the same material as the first interlayer insulating layer 111.

Recess regions RS may be formed to expose the heater electrodes HE. The formation of the recess regions RS may include etching upper portions of the spacer patterns 127 and etching upper portions of the heater electrodes HE. Thereafter, an isotropic wet etching process may be performed to expand empty spaces formed by etching the upper portions of the heater electrodes HE and the upper portions of the spacer patterns 127. In some example embodiments, the isotropic wet etching process may be performed using an etchant including phosphoric acid.

Figure 9:
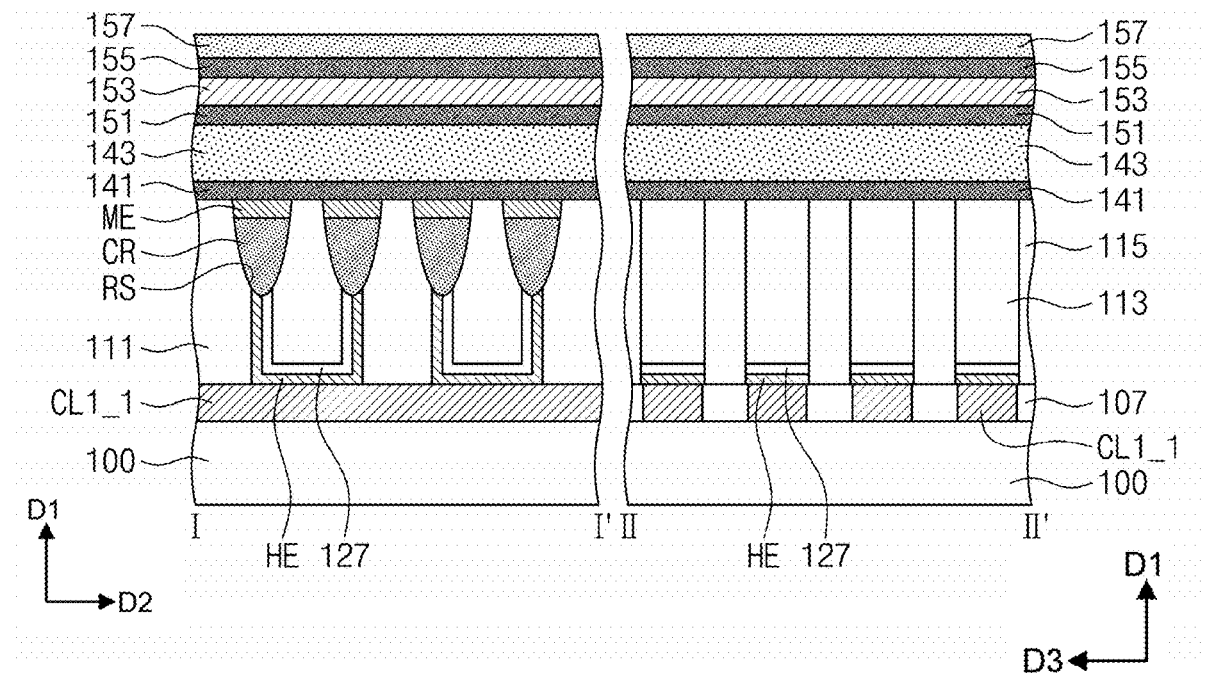

Referring to FIGS. 2 and 9, a variable resistance element CR and an intermediate electrode ME may be sequentially formed in each of the recess regions RS. In some example embodiments, a variable resistance layer may be formed to fill the recess regions RS, and then, an upper portion of the variable resistance layer may be etched to form the variable resistance elements CR. The variable resistance layer may be formed by a physical vapor deposition (PVD) method or a chemical vapor deposition (CVD) method.

The intermediate electrodes ME may be formed in upper portions of the recess regions RS. In some example embodiments, an electrode layer may be formed on the resultant structure having the variable resistance elements CR, and then, a planarization process may be performed on the electrode layer to form the intermediate electrodes ME. Alternatively, the process of forming the intermediate electrodes ME may be omitted. In some example embodiments, the intermediate electrodes ME may include at least one of W, Ti, Al, Cu, C, CN, TiN, TiAlN, TiSiN, TiCN, WN, CoSiN, WSiN, TaN, TaCN, or TaSiN.

A bottom carbon electrode layer 141, a switching layer 143, and a top electrode layer 151, 153 and 155 may be sequentially formed on the resultant structure having the intermediate electrodes ME. A mask layer 157 may be formed on the top electrode layer 151, 153 and 155. The top electrode layer 151, 153 and 155 may include a first carbon electrode layer 151, a metal layer 153, and a second carbon electrode layer 155. The first and second carbon electrode layers 151 and 155 may be formed of a conductive material including carbon. The metal layer 153 may be formed of at least one of W, Ti, Al, Cu, C, CN, TiN, TiAlN, TiSiN, TiCN, WN, CoSiN, WSiN, TaN, TaCN, or TaSiN. In some example embodiments, the switching layer 143 may be formed of a compound that includes at least one of Te or Se (i.e., chalcogenide elements) and at least one of Ge, Sb, Bi, Al, Pb, Sn, Ag, As, S, Si, In, Ti, Ga, or P. The switching layer 143 may further include a thermal stabilization element in addition to the compound.

Figure 10:
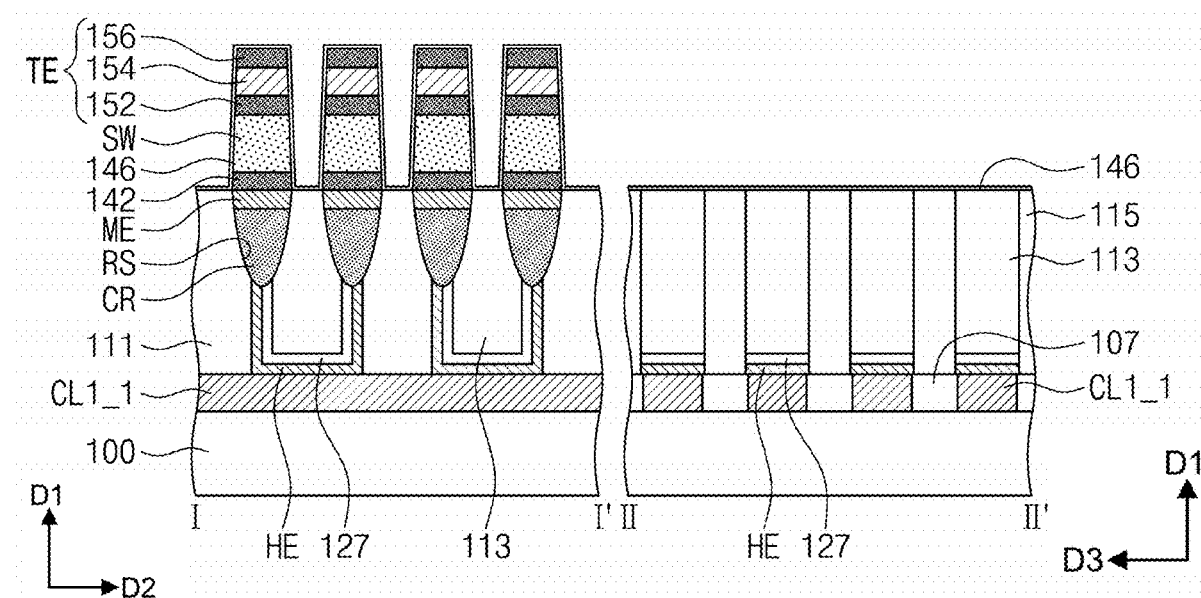

Referring to FIGS. 2 and 10, mask patterns may be formed from the mask layer 157, and then, the top electrode layer 151, 153 and 155, the switching layer 143, and the bottom carbon electrode layer 141 may be sequentially etched using the mask patterns as etch masks. As a result, upper structures, each of which includes a bottom carbon electrode pattern 142, a switching element SW, and a top electrode TE, may be formed. The top electrode TE may include a first carbon electrode pattern 152, a metal pattern 154, and a second carbon electrode pattern 156. The upper structures may be spaced apart from each other in the third direction D3 and the second direction D2 and may be two-dimensionally arranged.

A sidewall insulating layer 146 may be formed to cover the upper structures. In some example embodiments, the sidewall insulating layer 146 may be formed by a CVD process. The sidewall insulating layer 146 may be formed of a material not including oxygen. In some example embodiments, the sidewall insulating layer 146 may include a silicon nitride layer.

Referring again to FIGS. 2 and 3, a first insulating layer 161 may be formed between the upper structures. Thereafter, a planarization process may be performed. The mask patterns may be removed in the planarization process. In addition, a portion of the second carbon electrode pattern 156 and a portion of the sidewall insulating layer 146 may also be removed. As a result, after the planarization process, a thickness of the second carbon electrode pattern 156 may be less than a thickness of the first carbon electrode pattern 152.

First bit lines CL2_1 may be formed on the top electrodes TE. The formation of the first bit lines CL2_1 may include forming a conductive layer on the top electrodes TE, and patterning the conductive layer. Thereafter, a second insulating layer 117 may be formed to fill spaces between the first bit lines CL2_1. In some example embodiments, each of the first and second insulating layers 161 and 117 may include a silicon oxide layer and/or a silicon oxynitride layer.

Formation of the first memory cell stack MCA1 may be completed through the processes described above. Thereafter, a third insulating layer 109 may be formed on the first memory cell stack MCA1, and then, a second memory cell stack MCA2 may be formed by repeating the processes described with reference to FIGS. 7 to 10 and 3.

Figure 11:
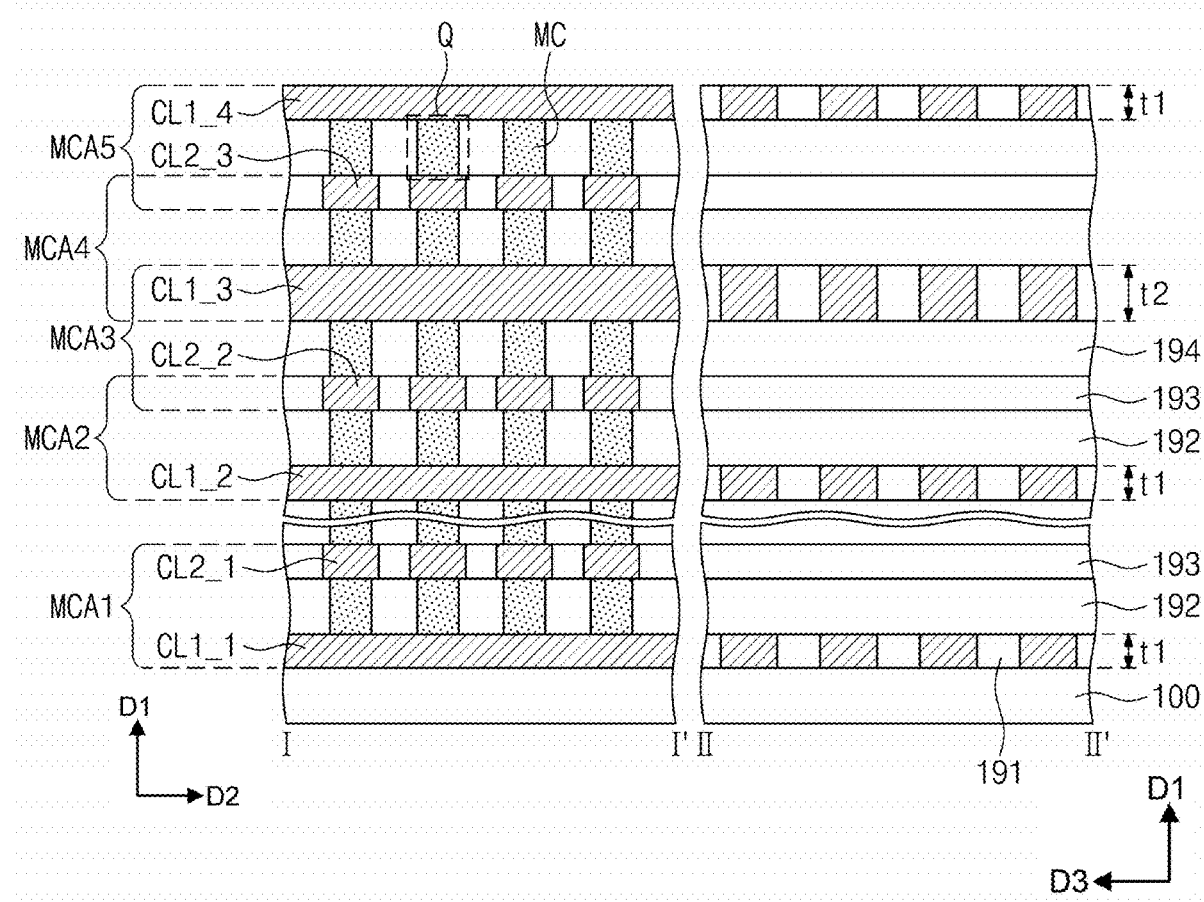
FIGS. 11 and 12 are cross-sectional views taken along the lines I-I' and II-II' of FIG. 2 to illustrate variable resistance memory devices according to some example embodiments of the inventive concepts.
Figure 12:
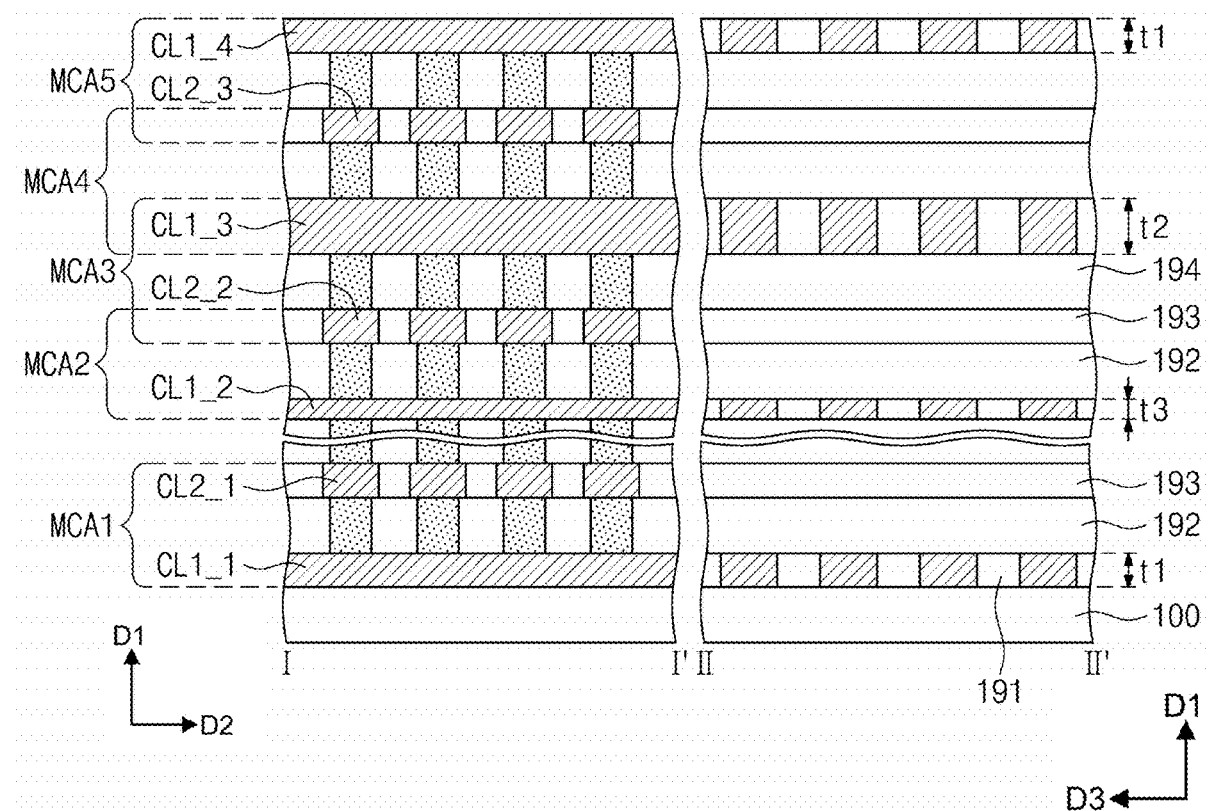
Figure 13:
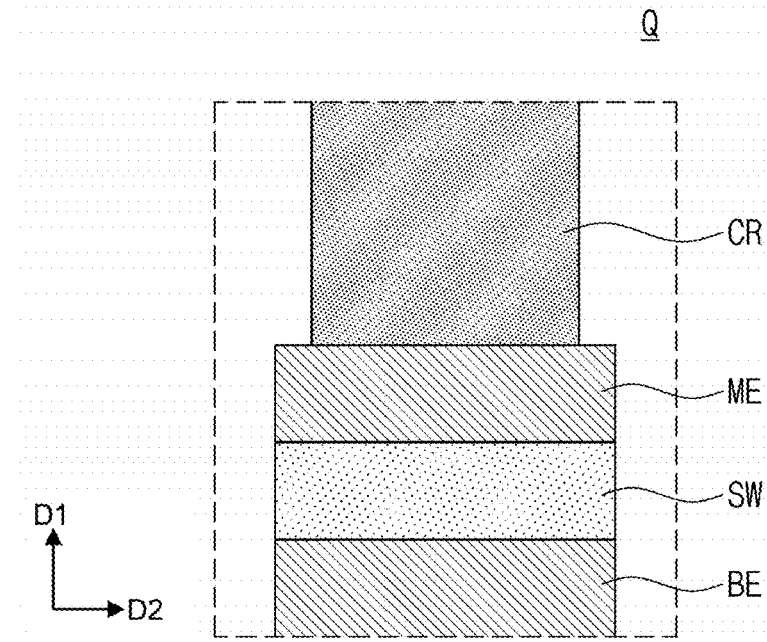
FIGS. 13 and 14 are enlarged views of a region 'Q' of FIG. 11.
Figure 14:
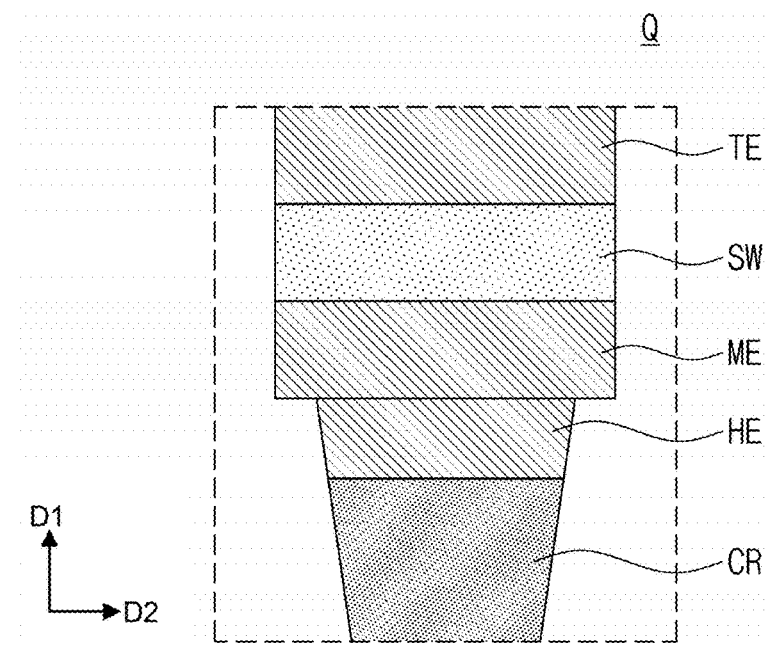

FIGS. 11 and 12 are cross-sectional views taken along the lines I-I' and II-II' of FIG. 2 to illustrate variable resistance memory devices according to some example embodiments of the inventive concepts. FIGS. 13 and 14 are enlarged views of a region 'Q' of FIG. 11.

Referring to FIGS. 2 and 11, a variable resistance memory device according to the present example embodiment may include first to fifth memory cell stacks MCA1 to MCA5 sequentially stacked on a substrate 100. The memory cell stacks adjacent to each other may share bit lines. In some example embodiments, the second memory cell stack MCA2 and the third memory cell stack MCA3 may share second bit lines CL2_2, and the fourth memory cell stack MCA4 and the fifth memory cell stack MCA5 may share third bit lines CL2_3. A second thickness t2 of third word lines CL1_3 may be greater than a first thickness t1 of word lines of other memory cell stacks.

Referring to FIG. 12, a second thickness t2 of third word lines CL1_3 may be greater than a first thickness t1 of word lines of other memory cell stacks. A third thickness t3 of second word lines CL1_2 may be less than the first thickness t1.

Each of memory cells of FIGS. 11 and 12 may have a structure of FIG. 13 or 14. In some example embodiments, a bottom electrode BE, a switching element SW, an intermediate electrode ME and a variable resistance element CR may be sequentially stacked as illustrated in FIG. 13. Alternatively, a variable resistance element CR, a heater electrode HE, an intermediate electrode ME, a switching element SW and a top electrode TE may be sequentially stacked as illustrated in FIG. 14.

Figure 15:
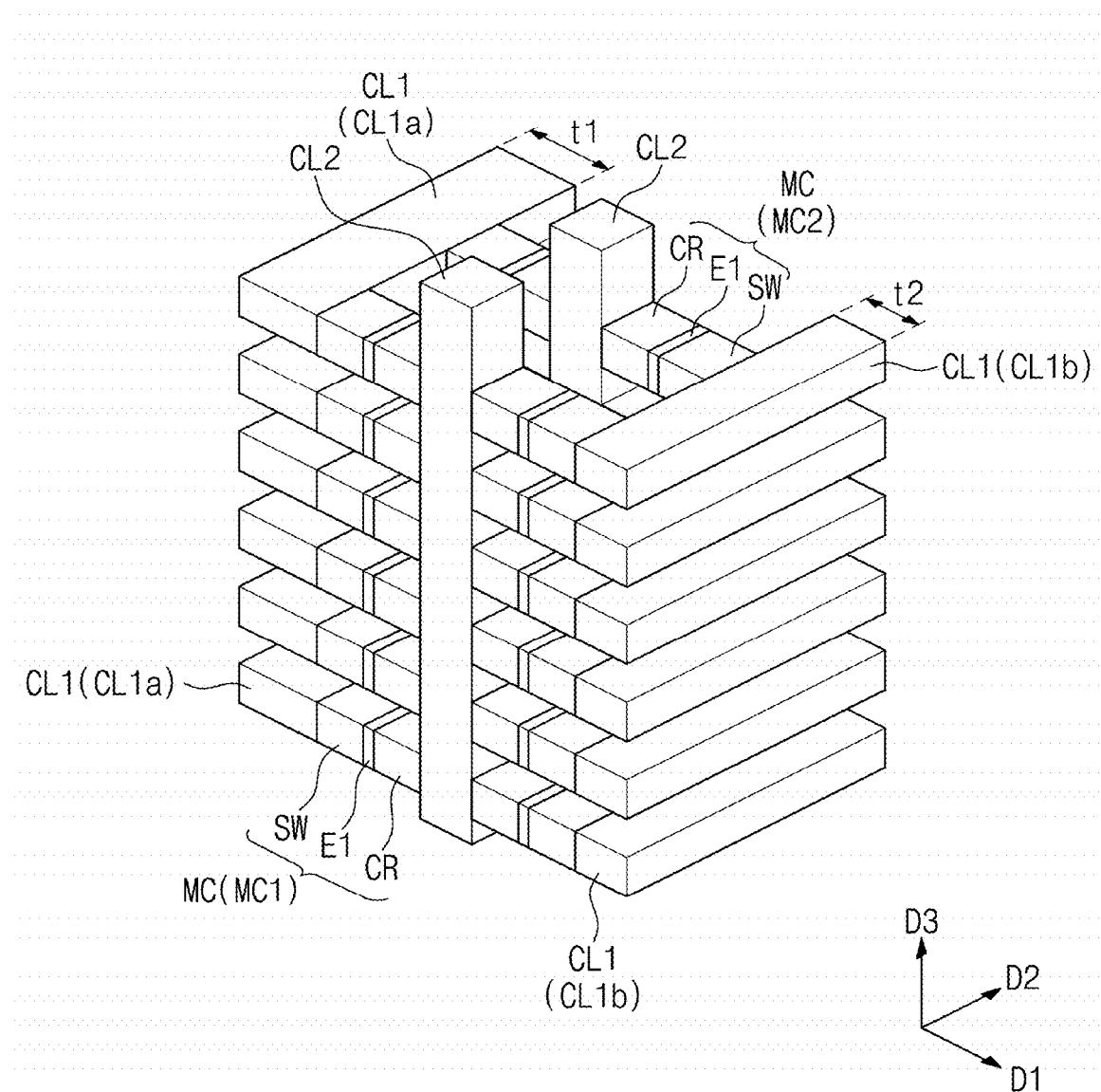
FIG. 15 is a perspective view schematically illustrating a variable resistance memory device according to some example embodiments of the inventive concepts.

FIG. 15 is a perspective view schematically illustrating a variable resistance memory device according to some example embodiments of the inventive concepts.

Referring to FIG. 15, word lines CL1 and bit lines CL2 intersecting the word lines CL1 may be provided. The word lines CL1 may extend in a second direction D2. The word lines CL1 may include first sub-word lines CL1a provided at one side of the bit lines CL2 and second sub-word lines CL1b provided at another side of the bit lines CL2. The second sub-word lines CL1b may be spaced apart from the first sub-word lines CL1a in a first direction D1 intersecting the second direction D2. The first sub-word lines CL1a may be spaced apart from each other in a third direction D3 perpendicular to the first and second directions D1 and D2, and the second sub-word lines CL1b may also be spaced apart from each other in the third direction D3. The bit lines CL2 may extend in the third direction D3 and may be spaced apart from each other in the second direction D2.

Memory cells MC may be provided at intersection points of the word lines CL1 and the bit lines CL2, respectively. The memory cells MC may include first memory cells MC1 provided at intersection points of the first sub-word lines CL1a and the bit lines CL2, respectively, and second memory cells MC2 provided at intersection points of the second sub-word lines CL1b and the bit lines CL2, respectively. The first memory cells MC1 may be spaced apart from each other in the third direction D3. The second memory cells MC2 may be spaced apart from each other in the third direction D3.

Each of the memory cells MC may include a variable resistance element CR and a switching element SW. Each of the memory cells MC may further include an electrode E1 disposed between the variable resistance element CR and the switching element SW. The electrode E1 will be described later in detail with reference to FIGS. 16A to 16D.

A first width t1, in the first direction D1, of the first sub-word lines CL1a may be greater than a second width t2, in the first direction D1, of the second sub-word lines CL1b. A thickness of the bit lines CL2 in the first direction D1 may be substantially equal to the second width t2. However, example embodiments of the inventive concepts are not limited thereto. The thicknesses of the sub-word lines CL1a and CL1b are not limited to the above descriptions, and the features of the example embodiments described with reference to FIGS. 2 to 14 may be applied to the sub-word lines CL1a and CL1b.

Each of the first memory cells MC1 and each of the second memory cells MC2 may be symmetrical with respect to a corresponding one of the bit lines CL2. In some example embodiments, the variable resistance element CR of each of the first memory cells MC1 and the variable resistance element CR of each of the second memory cells MC2 may be connected in common to the corresponding bit line CL2, and the switching element SW of each of the first memory cells MC1 and the switching element SW of each of the second memory cells MC2 may be connected to a corresponding one of the first sub-word lines CL1a and a corresponding one of the second sub-word lines CL1b, respectively.

Figure 16A:
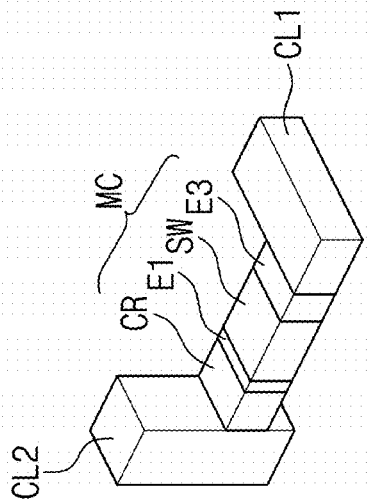
FIGS. 16A to 16D are perspective views illustrating unit memory cells of variable resistance memory devices according to some example embodiments of the inventive concepts.
Figure 16C:
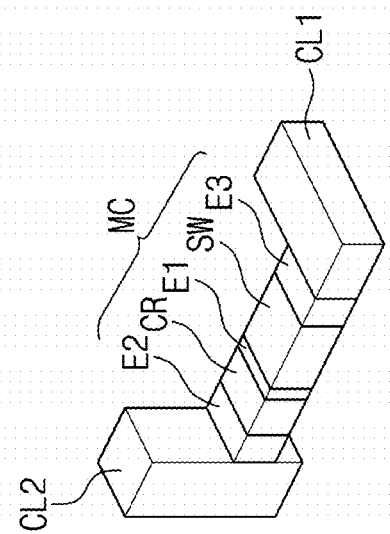
Figure 16B:
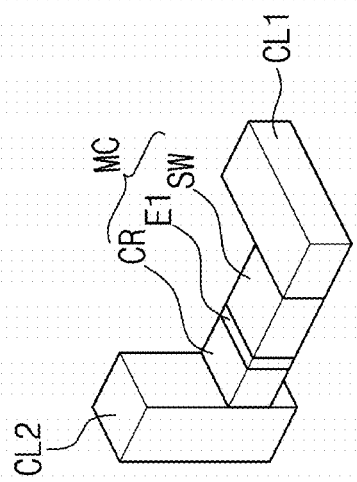
Figure 16D:
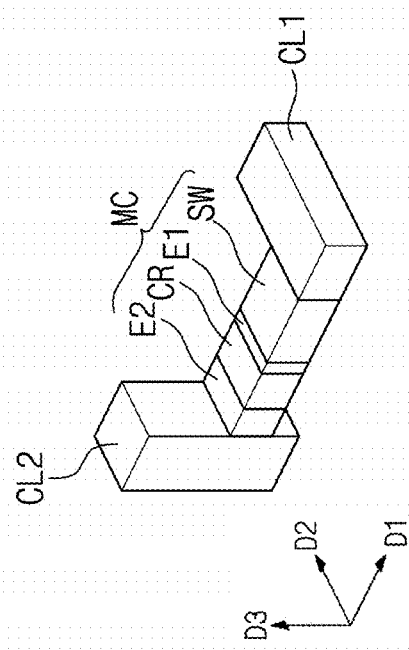

FIGS. 16A to 16D are perspective views illustrating unit memory cells of variable resistance memory devices according to some example embodiments of the inventive concepts. Referring to FIGS. 16A to 16D, the memory cell MC may be provided between the word line CL1 and the bit line CL2 which intersect each other. In some example embodiments, as illustrated in FIG. 16A, the memory cell MC may further include a first electrode E1 disposed between the variable resistance element CR and the switching element SW. In certain example embodiments, as illustrated in FIG. 16B, the memory cell MC may further include the first electrode E1 disposed between the variable resistance element CR and the switching element SW, and a second electrode E2 disposed between the variable resistance element CR and the bit line CL2. In certain example embodiments, as illustrated in FIG. 16C, the memory cell MC may further include the first electrode E1 disposed between the variable resistance element CR and the switching element SW, and a third electrode E3 disposed between the switching element SW and the word line CL1. The third electrode E3 may be spaced apart from the first electrode E1 with the switching element SW interposed therebetween. In certain example embodiments, as illustrated in FIG. 16D, the memory cell MC may further include the first electrode E1 disposed between the variable resistance element CR and the switching element SW, the second electrode E2 disposed between the variable resistance element CR and the bit line CL2, and the third electrode E3 disposed between the switching element SW and the word line CL1.

Figure 17:
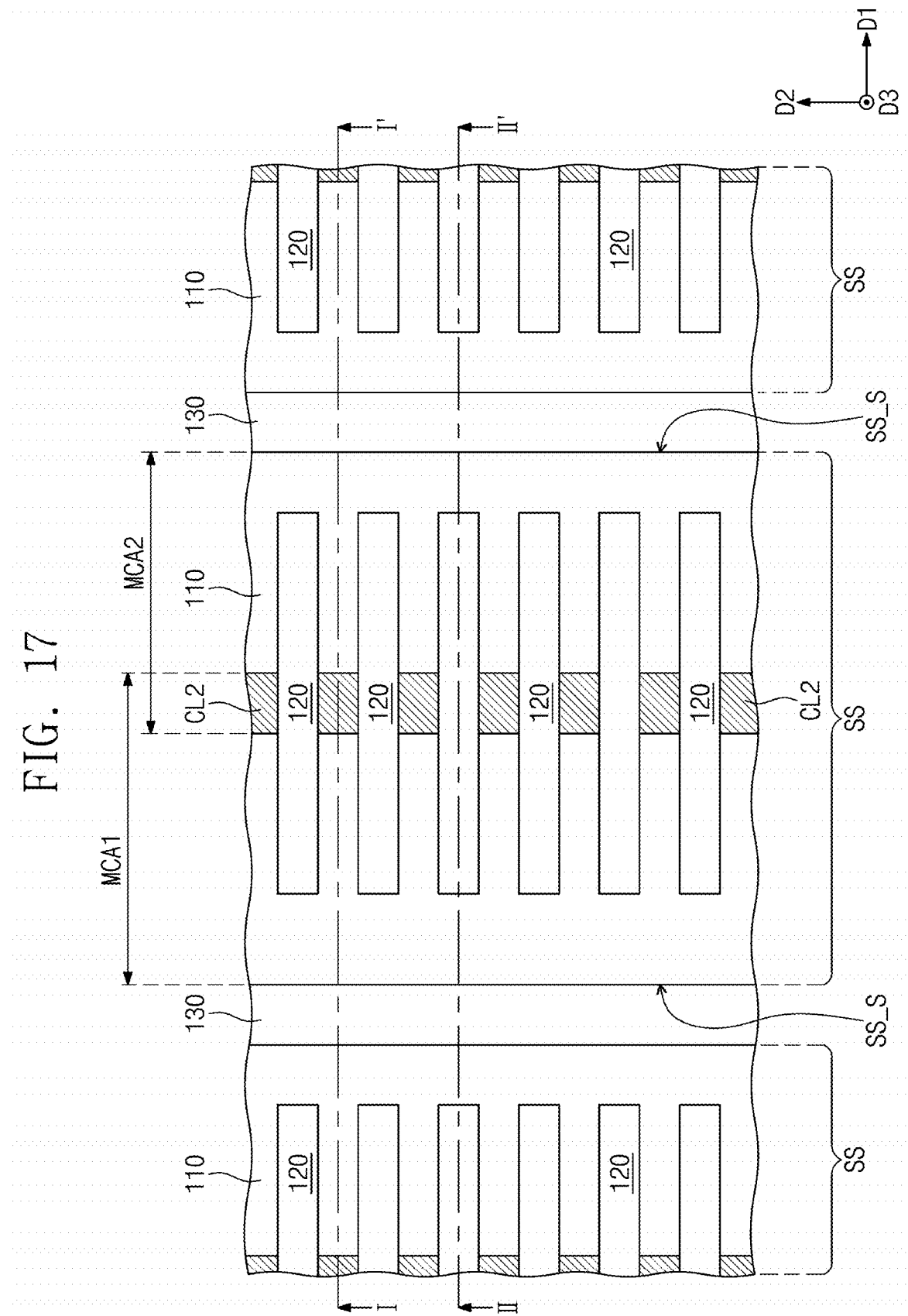
FIG. 17 is a plan view illustrating a variable resistance memory device according to some example embodiments of the inventive concepts.
Figure 18:
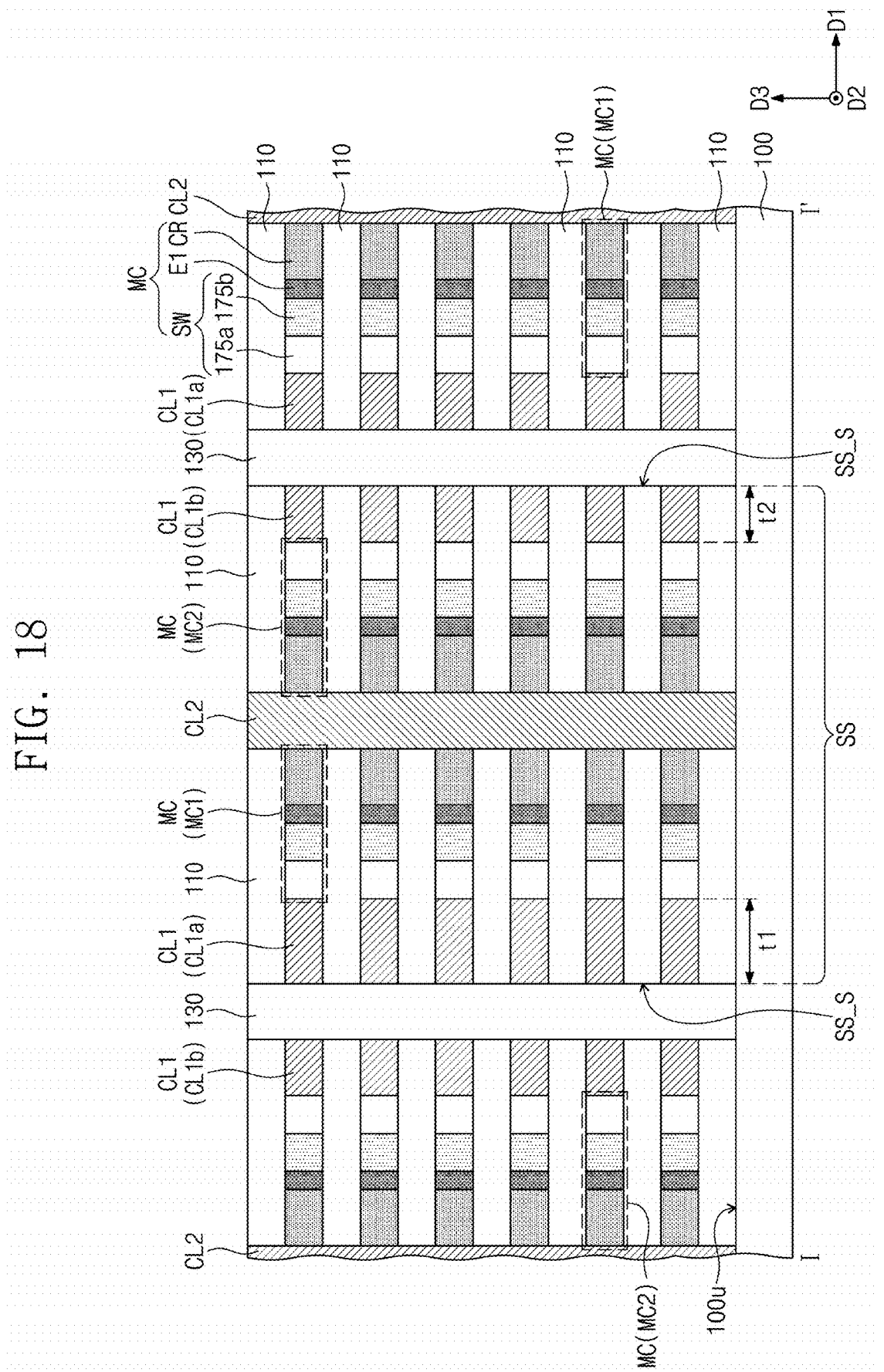
FIG. 18 is a cross-sectional view taken along a line I-I' of FIG. 17.
Figure 19:
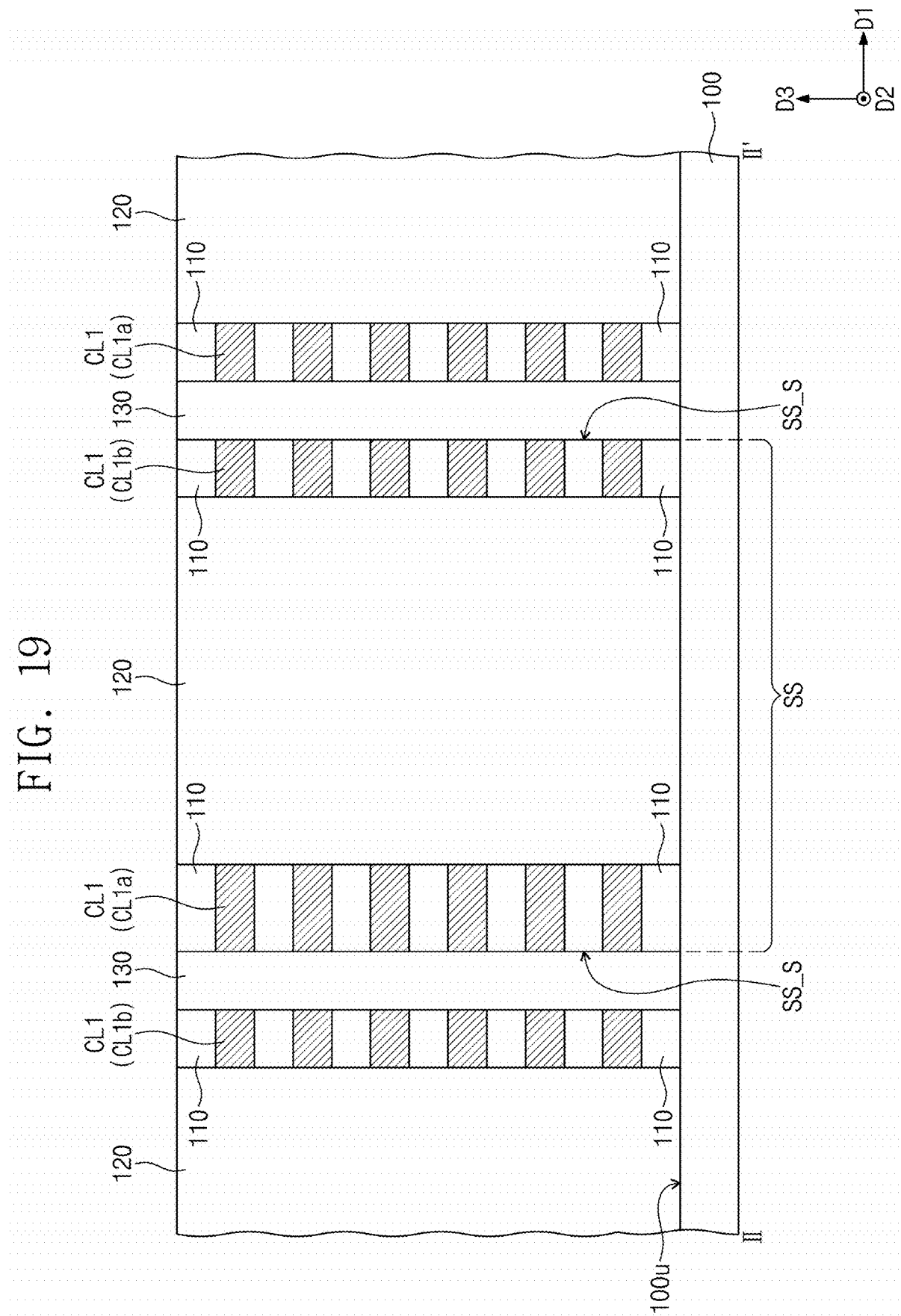
FIG. 19 is a cross-sectional view taken along a line II-II' of FIG. 17.

FIG. 17 is a plan view illustrating a variable resistance memory device according to some example embodiments of the inventive concepts. FIG. 18 is a cross-sectional view taken along a line I-I' of FIG. 17, and FIG. 19 is a cross-sectional view taken along a line II-II' of FIG. 17. FIG. 20 is a plan view illustrating arrangement of word lines, bit lines and memory cells of FIG. 17. FIGS. 17 to 20 illustrate a detailed example embodiment of FIG. 15, and the descriptions to the same features and/or components as in the example embodiment of FIG. 15 will be omitted or mentioned briefly for the purpose of ease and convenience in explanation.

Referring to FIGS. 17 to 20, a stack structure SS may be provided on a substrate 100. The stack structure SS may include a first memory cell stack MCA1 and a second memory cell stack MCA2. The stack structure SS may be provided in plurality, and the plurality of stack structures SS may be separated from each other in a first direction D1 with isolation insulating patterns 130 interposed therebetween.

The stack structure SS may extend in a second direction D2 parallel to a top surface 100u of the substrate 100. The isolation insulating patterns 130 may cover both sidewalls SS_S of the stack structure SS, respectively. The isolation insulating patterns 130 may include, in some example embodiments, an oxide, a nitride, and/or an oxynitride.

The stack structure SS may include insulating layers 110 and word lines CL1, which are alternately stacked in a third direction D3 perpendicular to the top surface 100u of the substrate 100. A pair of word lines CL1 among the word lines CL1 may be disposed on each of the insulating layers 110. The pair of word lines CL1 may be spaced apart from each other in the first direction D1 on each of the insulating layers 110. The word lines CL1 may include first sub-word lines CL1a and second sub-word lines CL1b. The pair of word lines CL1 may include one of the first sub-word lines CL1a and one of the second sub-word lines CL1b.

The stack structure SS may include bit lines CL2 disposed between the first sub-word lines CL1a and the second sub-word lines CL1b. The bit lines CL2 may extend in the third direction D3 and may be spaced apart from each other in the second direction D2. The word lines CL1 and the bit lines CL2 may include a metal (e.g., copper, tungsten, or aluminum) and/or a metal nitride (e.g., tantalum nitride, titanium nitride, or tungsten nitride). The insulating layers 110 may include, in some example embodiments, silicon nitride.

The stack structure SS may further include filling insulation patterns 120 disposed between the first sub-word lines CL1a and the second sub-word lines CL1b. The filling insulation patterns 120 may extend in the third direction D3 and may be spaced apart from each other in the second direction D2. The bit lines CL2 and the filling insulation patterns 120 may be alternately arranged in the second direction D2. The filling insulation patterns 120 may include, in some example embodiments, an oxide, a nitride, and/or an oxynitride.

The stack structure SS may include memory cells MC (e.g., first memory cells MC1 and second memory cells MC2), which are provided at intersection points of the word lines CL1 and the bit lines CL2, respectively. Each of the memory cells MC may include a variable resistance element CR, a switching element SW, and a first electrode E1 disposed between the variable resistance element CR and the switching element SW. In some example embodiments, the switching element SW may be a diode. In this case, the switching element SW may include a first junction pattern 175a and a second junction pattern 175b, which have different conductivity types from each other. The first junction pattern 175a may have a first conductivity type, and the second junction pattern 175b may have a second conductivity type different from the first conductivity type. In some example embodiments, the first conductivity type may be a P-type and the second conductivity type may be an N-type. Alternatively, the first conductivity type may be the N-type and the second conductivity type may be the P-type. The second junction pattern 175b may include dopants of the second conductivity type. The first junction pattern 175a may include dopants of the first conductivity type and dopants of the second conductivity type. Here, in the first junction pattern 175a, a concentration of the dopants of the first conductivity type may be greater than a concentration of the dopants of the second conductivity type. In some example embodiments, the switching element SW may be a silicon diode or oxide diode which has a rectifying property. In other words, the switching element SW may be a silicon diode of P-type silicon and N-type silicon or may be an oxide diode of P-type $NiO_x$ and N-type $TiO_x$ or an oxide diode of P-type $CuO_x$ and N-type $TiO_x$. In certain example embodiments, the switching element SW may include an ovonic threshold switch (OTS) element having a bi-directional characteristic.

The first sub-word lines CL1a, the first memory cells MC1 and the bit lines CL2 may constitute the first memory cell stack MCA1, and the second sub-word lines CL1b, the second memory cells MC2 and the bit lines CL2 may constitute the second memory cell stack MCA2. In other words, the first memory cell stack MCA1 and the second memory cell stack MCA2 may share the bit lines CL2, like the example embodiments of FIGS. 11 and 12. A first width t1, in the first direction D1, of the first sub-word lines CL1a may be greater than a second width t2, in the first direction D1, of the second sub-word lines CL1b.

FIGS. 21A to 25A are plan views illustrating a method of manufacturing a variable resistance memory device, according to some example embodiments of the inventive concepts. FIGS. 21B to 25B are cross-sectional views taken along lines I-I' of FIGS. 21A to 25A, respectively, and FIGS. 21C to 25C are cross-sectional views taken along lines II-II' of FIGS. 21A to 25A, respectively.

Figure 21A:
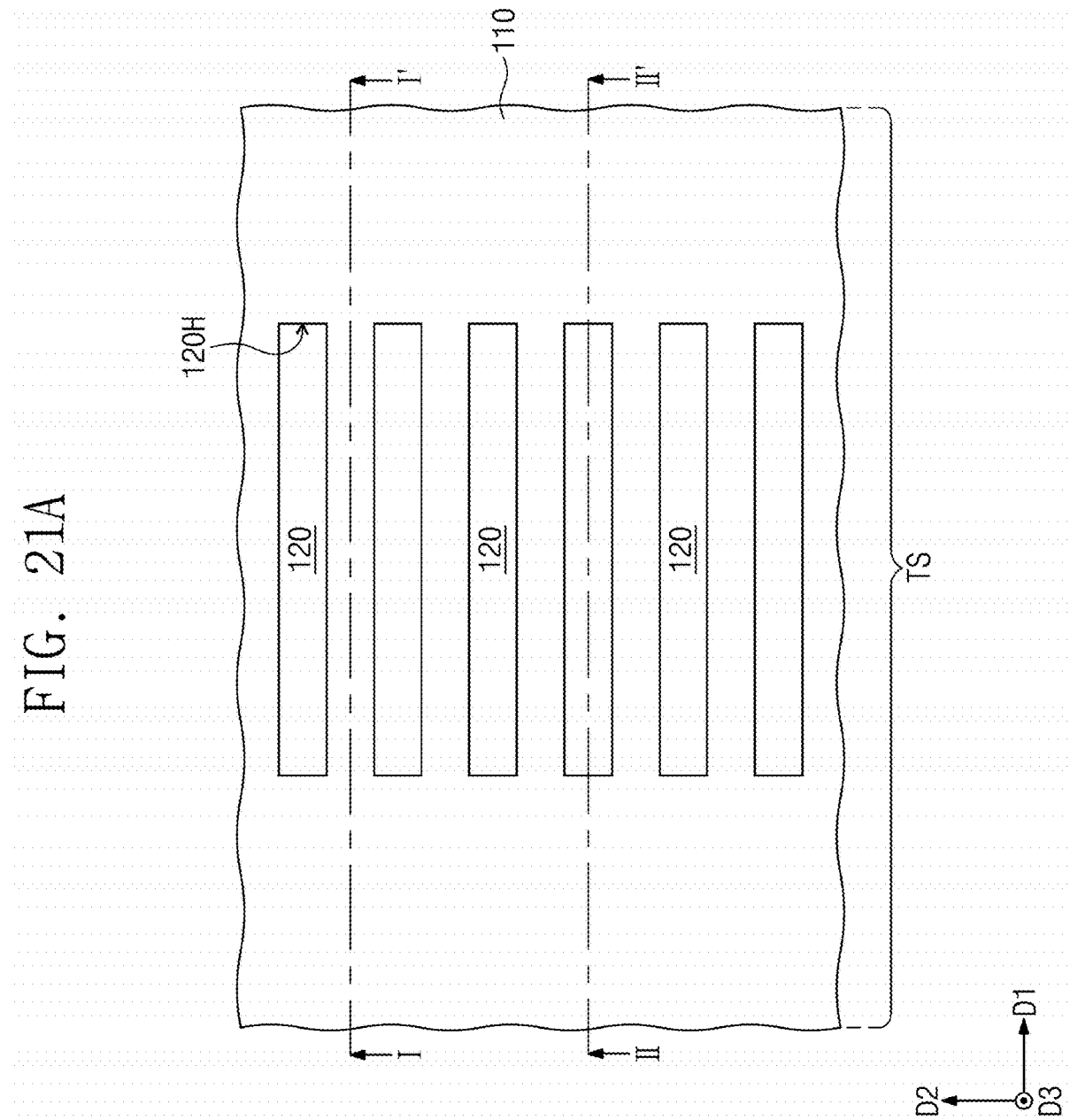

Referring to FIGS. 21A to 21C, a thin-layer structure TS may be formed on a substrate 100. The thin-layer structure TS may include insulating layers 110 and sacrificial layers 175, which are stacked on a top surface 100u of the substrate 100. The insulating layers 110 and the sacrificial layers 175 may be alternately and repeatedly stacked in the third direction D3. The sacrificial layers 175 may include silicon doped with dopants of the second conductivity type or a metal oxide doped with dopants of the second conductivity type. The insulating layers 110 may include a material having an etch selectivity with respect to the sacrificial layers 175. The insulating layers 110 may include, in some example embodiments, silicon nitride.

Filling insulation patterns 120 may be formed in the thin-layer structure TS. The filling insulation patterns 120 may penetrate the thin-layer structure TS and may be in contact with the top surface 100u of the substrate 100. In some example embodiments, the formation of the filling insulation patterns 120 may include forming through-holes 120H penetrating the thin-layer structure TS, forming a filling insulation layer filling the through-holes 120H on the thin-layer structure TS, and planarizing the filling insulation layer.

Referring to FIGS. 22A to 22C, trenches 130T may be formed to penetrate the thin-layer structure TS. The trenches 130T may extend in the second direction D2. Sidewalls of the sacrificial layers 175, which are exposed by each of the trenches 130T, may be recessed to form first recess regions R1 between the insulating layers 110. The first recess regions R1 may include first regions RL, and second regions RR spaced apart from the first regions RL in the first direction D1 with the filling insulation patterns 120 interposed therebetween. A depth t5 of the first regions RL in the first direction D1 may be greater than a depth t6 of the second regions RR in an opposite direction to the first direction D1. A difference between the depths t5 and t6 may be realized or formed by various methods. In some example embodiments, the formation of the first regions RL and the second regions RR may be performed by different etching processes using different mask patterns. In some example embodiments, the mask pattern may expose the trench 130T at one side of the filling insulation patterns 120 and may cover the trench 130T at another side of the filling insulation patterns 120. Process times and/or etching amounts of the different etching processes may be adjusted to generate the difference between the depths t5 and t6.

In some example embodiments, the formation of the first recess regions R1 may include etching the sacrificial layers 175 by performing an etching process having an etch selectivity with respect to the insulating layers 110, the filling insulation patterns 120 and the substrate 100. The first recess regions R1 may laterally extend from each of the trenches 130T. The first recess regions R1 may extend in the second direction D2 and may be spaced apart from each other in the third direction D3.

Figure 23A:
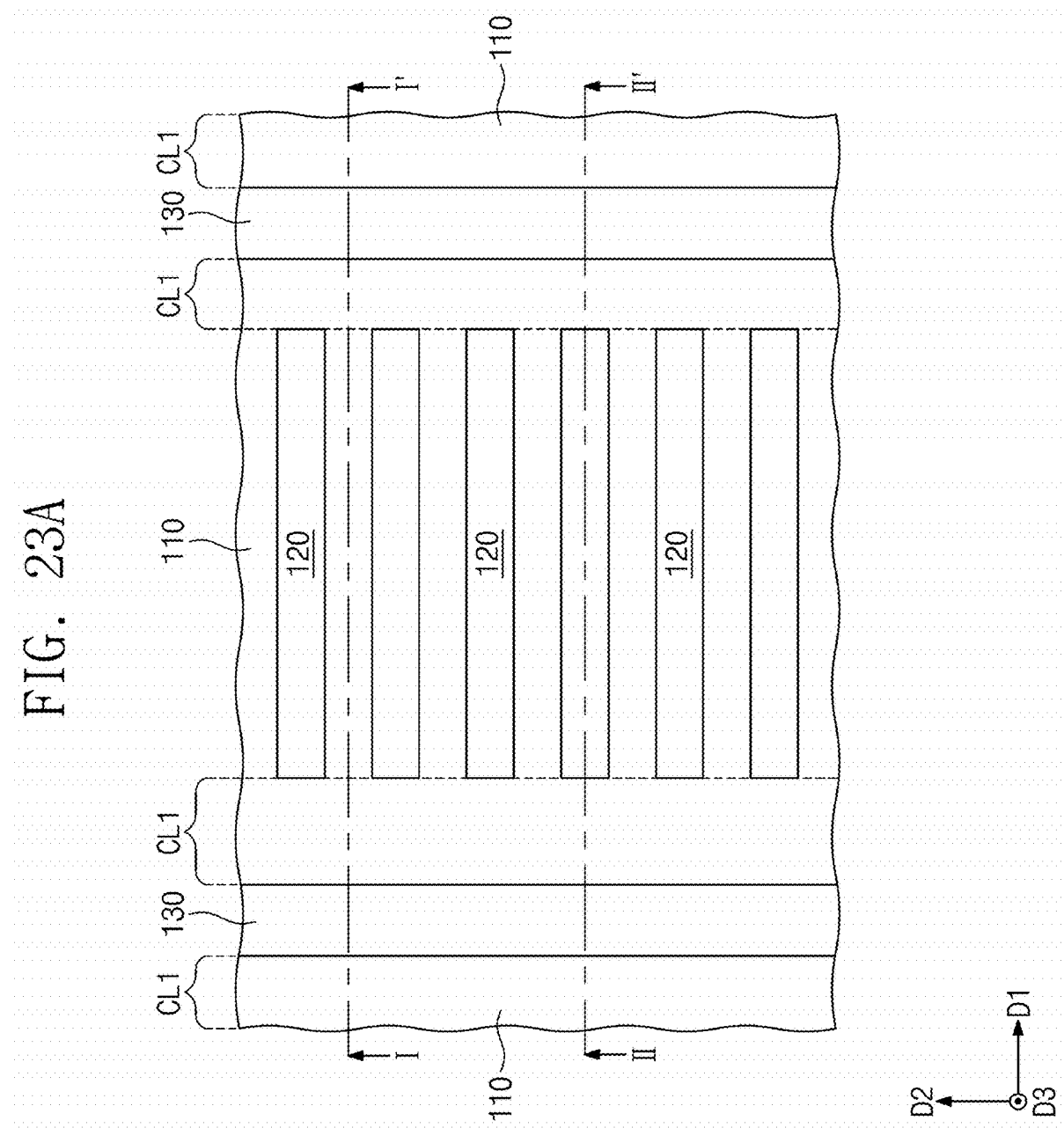
Figure 23B:
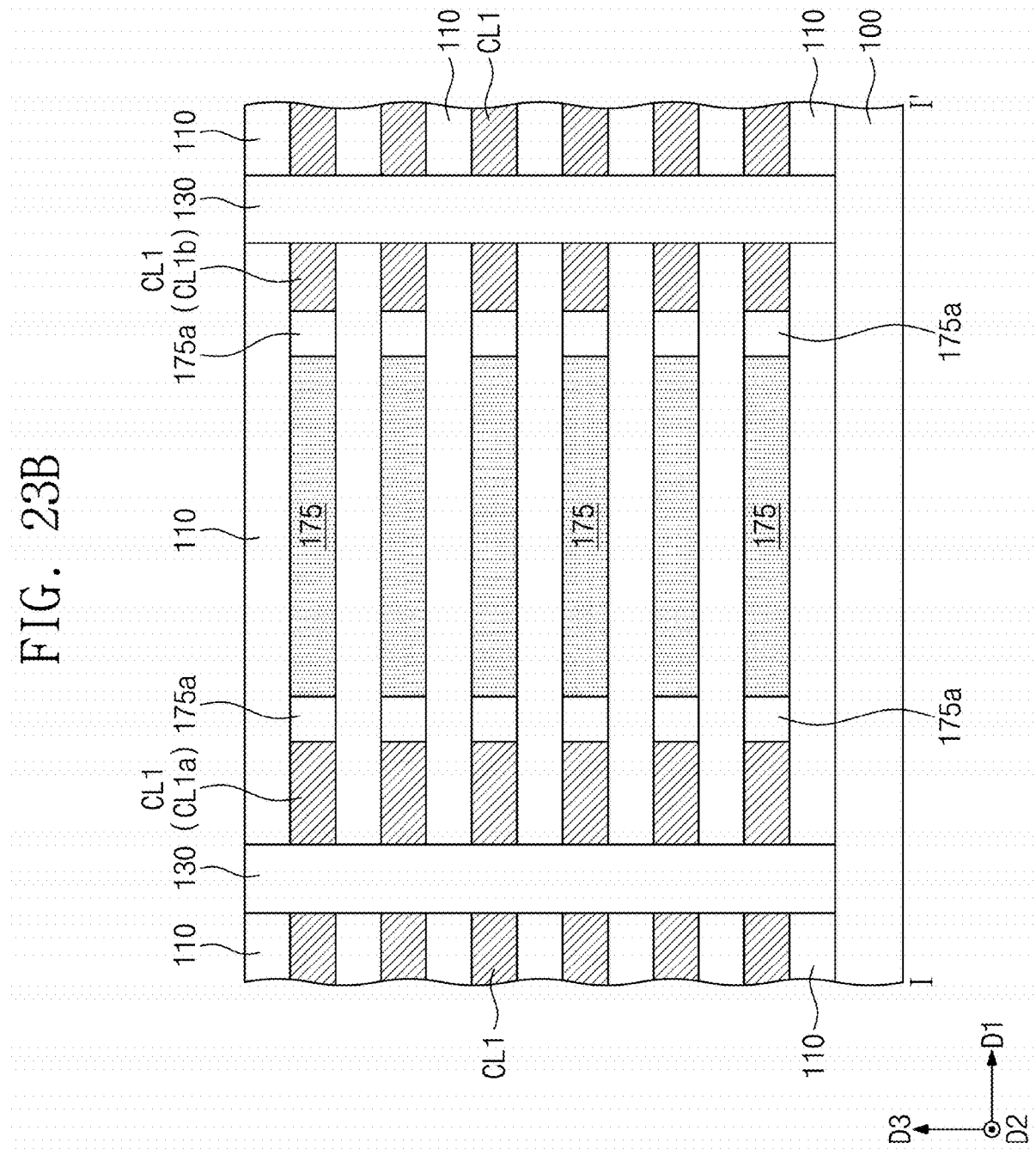

Referring to FIGS. 23A to 23C, portions of the sacrificial layers 175 exposed by the first recess regions R1 may be doped with dopants of the first conductivity type. Thus, a first junction pattern 175a may be formed at a side of each of the sacrificial layers 175. The dopants of the first conductivity type may be different from the dopants of the second conductivity type. The sacrificial layers 175 may include the dopants of the second conductivity type, and the first junction pattern 175a may be formed by doping a portion of each of the sacrificial layers 175 with the dopants of the first conductivity type. Thus, the first junction pattern 175a may include the dopants of the first conductivity type and the dopants of the second conductivity type. In the first junction pattern 175a, a concentration of the dopants of the first conductivity type may be greater than a concentration of the dopants of the second conductivity type.

After the formation of the first junction pattern 175a, word lines CL1 may be formed in the first recess regions R1, respectively. In some example embodiments, the formation of the word lines CL1 may include forming a first conductive layer filling the first recess regions R1 and at least a portion of each of the trenches 130T on the thin-layer structure TS, and removing the first conductive layer disposed outside the first recess regions R1. The first conductive layer may include a metal (e.g., copper, tungsten, or aluminum) and/or a metal nitride (e.g., tantalum nitride, titanium nitride, or tungsten nitride). Thereafter, isolation insulating patterns 130 may be formed in the trenches 130T, respectively.

Figure 24B:
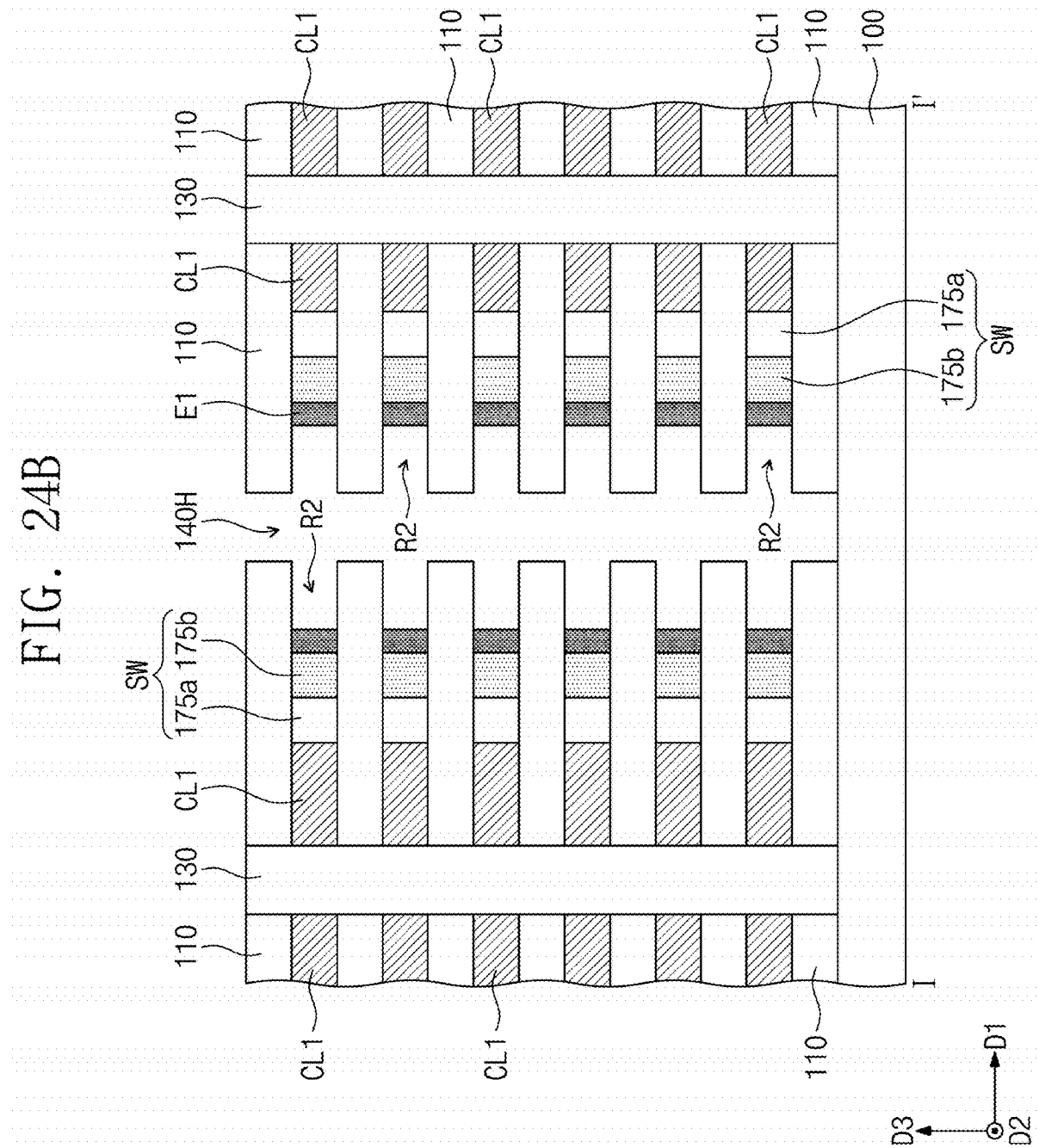

Referring to FIGS. 24A to 24C, vertical holes 140H may be formed to penetrate the thin-layer structure TS. The vertical holes 140H may be spaced apart from each other in the second direction D2 between the isolation insulating patterns 130. Each of the vertical holes 140H may expose sidewalls of the insulating layers 110 and the sacrificial layers 175 and may also expose the top surface 100u of the substrate 100. The sidewalls of the sacrificial layers 175, which are exposed by each of the vertical holes 140H, may be recessed to form second recess regions R2 between the insulating layers 110. In some example embodiments, the formation of the second recess regions R2 may include etching the sacrificial layers 175 by performing an etching process having an etch selectivity with respect to the insulating layers 110, the filling insulation patterns 120 and the substrate 100.

A first electrode E1 may be formed at a side of the sacrificial layer 175 exposed by each of the second recess regions R2. In some example embodiments, the formation of the first electrode E1 may include forming a metal layer covering the sidewall of the sacrificial layer 175 exposed by each of the second recess regions R2, performing a thermal treatment process to react the sidewall of the sacrificial layer 175 with the metal layer, and removing a remaining portion of the metal layer which does not react with the sidewall of the sacrificial layer 175. In this case, the first electrode E1 may include a metal silicide. A remaining portion of the sacrificial layer 175, which does not react with the metal layer, may be defined as a second junction pattern 175b. The second junction pattern 175b may include the dopants of the second conductivity type. The first junction pattern 175a and the second junction pattern 175b may constitute a switching element SW. The first junction pattern 175a and the second junction pattern 175b may have the first conductivity type and the second conductivity type, respectively.

Referring to FIGS. 25A to 25C, a variable resistance element CR may be formed in each of the second recess regions R2. The formation of the variable resistance element CR may include forming a variable resistance material layer filling the second recess regions R2 and at least a portion of each of the vertical holes 140H, and removing the variable resistance material layer from the vertical holes 140H. Thus, the variable resistance element CR may be locally formed in each of the second recess regions R2. The switching element SW, the first electrode E1 and the variable resistance element CR may constitute a memory cell MC. According to the example embodiments of the inventive concepts, the switching element SW and the variable resistance element CR may be horizontally arranged on the top surface 100u of the substrate 100. In this case, a photolithography process for forming the switching element SW and the variable resistance element CR may not be required, and difficulty of the etching processes for forming the switching element SW and the variable resistance element CR may be reduced. In other words, it may be easy to form the memory cell MC including the switching element SW and the variable resistance element CR.

Bit lines CL2 may be formed in the vertical holes 140H, respectively. The formation of the bit lines CL2 may include forming a second conductive layer filling the vertical holes 140H on the thin-layer structure TS, and planarizing the second conductive layer until the top surface of the thin-layer structure TS is exposed. The second conductive layer may include a metal and/or a metal nitride.

Figure 26:
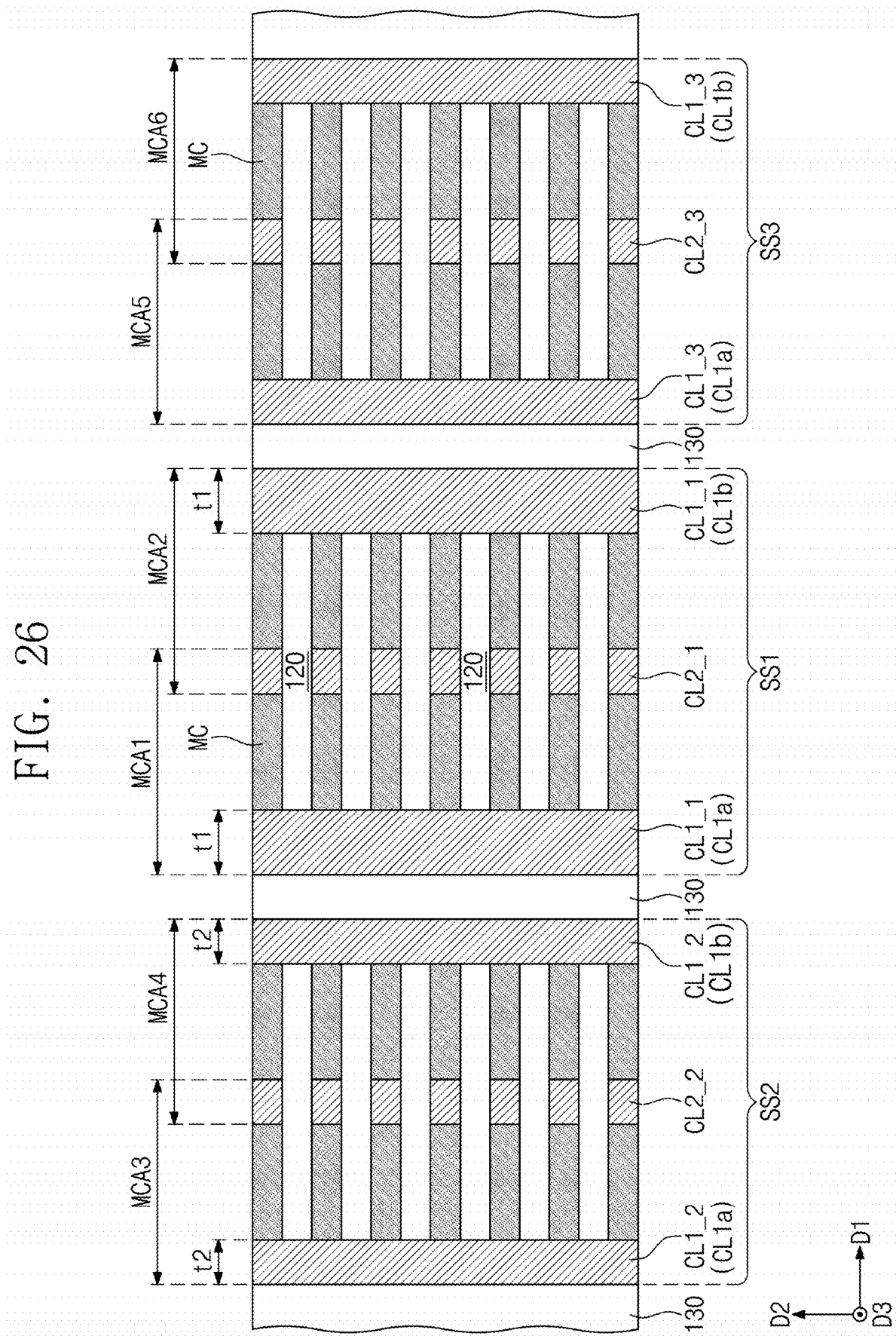
FIG. 26 is a plan view illustrating a variable resistance memory device according to some example embodiments of the inventive concepts.

FIG. 26 is a plan view illustrating a variable resistance memory device according to some example embodiments of the inventive concepts. Example embodiments of FIG. 26 may be similar to the example embodiments of FIGS. 17 to 20, and the descriptions to the same features and/or components as in the example embodiments of FIGS. 17 to 20 will be omitted hereinafter.

Referring to FIG. 26, stack structures SS2, SS1 and SS3 may be arranged in the first direction D1. A first stack structure SS1 may be disposed between a second stack structure SS2 and a third stack structure SS3, and the first to third stack structures SS1, SS2 and SS3 may be spaced apart from each other with isolation insulating patterns 130 interposed therebetween. The first stack structure SS1 may include first and second memory cell stacks MCA1 and MCA2, the second stack structure SS2 may include third and fourth memory cell stacks MCA3 and MCA4, and the third stack structure SS3 may include fifth and sixth memory cell stacks MCA5 and MCA6. The first stack structure SS1 may include first word lines CL1_1 disposed with first bit lines CL2_1 interposed therebetween, the second stack structure SS2 may include second word lines CL1_2 disposed with second bit lines CL2_2 interposed therebetween, and the third stack structure SS3 may include third word lines CL1_3 disposed with third bit lines CL2_3 interposed therebetween.

In the present example embodiment, thicknesses, in the first direction D1, of sub-word lines included in each of the stack structures SS1 to SS3 may be equal to each other. In some example embodiments, first sub-word lines CL1a and second sub-word lines CL1b of the first stack structure SS1 may have first thicknesses t1 in the first direction D1, which are equal to each other. The thickness, in the first direction D1, of the word lines of at least one of the stack structures SS1, SS2 and SS3 may be different from the thickness, in the first direction D1, of the word lines of other(s) of the stack structures SS1, SS2 and SS3. In some example embodiments, the first width t1 of the first word lines CL1_1 of the first stack structure SS1 may be greater than a second width t2 of the second word lines CL1_2 of the second stack structure SS2. A thickness, in the first direction D1, of the third word lines CL1_3 of the third stack structure SS3 may be equal to or less than the second width t2.

In the variable resistance memory device according to the example embodiments of the inventive concepts, the snap back phenomenon may be controlled by adjusting the thicknesses of the word lines of the memory cell stacks. In other words, the snap back phenomenon may be mitigated by increasing the thickness of the word lines, or the snap back phenomenon may be enhanced by reducing the thickness of the word lines. Thus, the electrical characteristics of the variable resistance memory device may be improved.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A variable resistance memory device comprising:
a substrate; and
stack structures on a top surface of the substrate, arranged in a first direction,
wherein each stack structure of the stack structures includes:
word lines extending in a second direction parallel to the top surface of the substrate and arranged in a third direction perpendicular to the top surface of the substrate, the word lines including first sub-word lines; and second sub-word lines spaced apart from the first sub-word lines in the first direction, the first direction intersecting the second direction and the third direction;
respective bit lines between respective first sub-word lines of the first sub-word lines and the respective second sub-word lines of the second sub-word lines and arranged in the second direction; and
memory cells at intersection points of respective first sub-word lines of the first sub-word lines and the respective bit lines and intersection points of respective second sub-word lines of the second sub-word lines and the respective bit lines, wherein each memory cell of the memory cells comprises a switching element and a variable resistance element,
wherein the stack structures include a first stack structure comprising the first sub-word lines and the second sub-word lines; and a second stack structure comprising third sub-word lines and fourth sub-word lines,
wherein a width, in the first direction, of at least one of the first to fourth sub-word lines is different from widths, in the first direction, of others of the first to fourth sub-word lines.

2. The variable resistance memory device of claim 1, wherein a first width of the first sub-word lines in the first direction is greater than a second width of the second sub-word lines in the first direction.

3. The variable resistance memory device of claim 1, wherein the second sub-word lines are connected to the bit lines through second memory cells,
wherein the first sub-word lines are connected to the bit lines through first memory cells,
wherein the first memory cells include first switching elements; and first variable resistance elements between the first switching elements and the bit lines, and
wherein the second memory cells include second switching elements; and second variable resistance elements between the second switching elements and the bit lines.

4. The variable resistance memory device of claim 1, wherein a first width of the first sub-word lines in the first direction is greater than a third width of the third sub-word lines in the first direction.

5. The variable resistance memory device of claim 4, wherein the firth width of the first sub-word lines is equal to a second width of the second sub-word lines in the first direction, and
wherein the third width of the third sub-word lines is equal to a fourth width of the fourth sub-word lines in the first direction.

6. The variable resistance memory device of claim 1, wherein a width of the first sub-word lines in the first direction is greater than a width of the bit lines in the first direction.

7. A variable resistance memory device comprising:
memory cell stacks arranged in a first direction, the memory cell stacks including a first memory cell stack and a second memory cell stack, and each memory cell stack of the memory cell stacks includes:
a plurality of word lines, each word line of the plurality of word lines extending in a second direction intersecting the first direction and arranged in a third direction intersecting the first direction and the second direction; and
a respective memory cell connected to a respective word line of the plurality of word lines, the respective memory cell including a switching element and a variable resistance element,
wherein each respective word line of the plurality of word lines of the first memory cell stack has a first thickness, in the first direction, the first thickness of each respective word line of the plurality of word lines of the first memory cell stack being less than a second thickness, in the first direction, of each respective word line of the plurality of word lines of the second memory cell stack.

8. The variable resistance memory device of claim 7, wherein each memory cell stack of the memory cell stacks further includes a plurality of bit lines, each bit line of the plurality of bit lines extending in the third direction and arranged in the second direction, and
wherein the respective memory cell are is provided at intersection points of each respective word line of the plurality of word lines and each respective bit line of the plurality of bit lines.

9. The variable resistance memory device of claim 7, wherein each memory cell stack of the memory cell stacks further includes a plurality of bit lines, each bit line of the plurality of bit lines extending in the third direction and arranged in the second direction.

10. The variable resistance memory device of claim 7, wherein each memory cell stack of the memory cell stacks further includes a plurality of bit lines, each bit line of the plurality of bit lines extending in the third direction and arranged in the second direction, and
wherein the thicknesses, in the first direction, of respective bit lines of the plurality of bit lines in respective memory cell stacks of the memory cell stacks are substantially equal to each other.

11. The variable resistance memory device of claim 10, wherein the second thickness of each respective word line of the plurality of word lines of the second memory cell stack is greater than the thickness of each respective bit line of the plurality of bit lines in each respective memory cell stack of the memory cell stacks in the first direction.

12. The variable resistance memory device of claim 7, wherein the memory cell stacks include a third memory cell stack, and
wherein a third thickness, in the first direction, of each respective word line of the plurality of word lines of the third memory cell stack is less than the first thickness of each respective word line of the plurality of word lines of the first memory cell stack.

13. The variable resistance memory device of claim 7, wherein the memory cell stacks comprise a plurality of third memory cell stacks, each of the third memory cell stacks having a plurality of word lines having a respective thickness the same as the second thickness of each respective word line of the plurality of word lines of the second memory cell stack.

14. The variable resistance memory device of claim 7, further comprising:
a substrate having a top surface perpendicular to the first direction,
wherein the memory cell stacks are sequentially stacked on the substrate in the first direction, and
wherein the second direction and the third direction are parallel to the top surface of the substrate.

15. The variable resistance memory device of claim 14, wherein the switching element includes a material having a phase transition temperature higher than that of the variable resistance element.

16. The variable resistance memory device of claim 7, further comprising:
a substrate having a top surface perpendicular to the third direction,
wherein the first direction and the second direction are parallel to the top surface of the substrate.

17. The variable resistance memory device of claim 16, further comprising:
a plurality of bit lines extending in the third direction and arranged in the second direction,
wherein respective word lines of the plurality of word lines of the second memory cell stack are connected to respective bit lines of the plurality of bit lines through respective memory cells of the second memory cells, and
wherein respective word lines of the plurality of word lines of the first memory cell stack are connected to respective bit lines of the plurality of bit lines through respective memory cells of the first memory cells.

18. The variable resistance memory device of claim 17, wherein the first memory cells includes first switching elements; and first variable resistance elements between the first switching elements and the respective bit lines of the plurality of bit lines of the first memory cell stack, and
wherein the second memory cells includes second switching elements; and second variable resistance elements between the second switching elements and the respective bit lines of the plurality of bit lines of the second memory cell stack.

19. A variable resistance memory device comprising:
memory cell stacks on a substrate, wherein each of the memory cell stacks include
word lines having a thickness, in a first direction, and extending in a second direction and arranged in a third direction intersecting the second direction, the first direction intersecting the second and third directions;
bit lines extending in the third direction and arranged in the second direction; and
a respective memory cell is provided at respective intersection points of each respective word lines and respective bit lines, wherein each memory cell of the memory cells includes a switching element and a variable resistance element,
wherein the thickness, in the first direction, of the word lines of at least one of the memory cell stacks is different from thicknesses, in the first direction, of the word lines of other memory cell stacks.

20. The variable resistance memory device of claim 19, wherein the variable resistance memory device comprises a first memory cell stack of the memory cell stacks having first word lines and a second memory cell stack of the memory cell stacks having second word lines,
wherein the first word lines include a plurality of word lines, each word line of the plurality of word lines of the first word lines arranged in the third direction, and the second word lines include a plurality of word lines, each word line of the plurality of word lines of the second word lines arranged in the third direction,
wherein the first word lines are spaced apart from the second word lines in the first direction.

\* \* \* \* \*